(12) United States Patent
Passamani et al.

(10) Patent No.: US 12,393,212 B2
(45) Date of Patent: Aug. 19, 2025

(54) SPLIT PASS DEVICE APPLICATIONS FOR DAC SUPPLY SYSTEMS

(71) Applicant: Apple Inc., Cupertino, CA (US)

(72) Inventors: Antonio Passamani, Munich (DE); Timo W Gossmann, Neubiberg (DE); Adrien F Vargas, Munich (DE); Guillaume Gourlat, Munich (DE)

(73) Assignee: Apple Inc., Cupertino, CA (US)

( * ) Notice: Subject to any disclaimer, the term of this patent is extended or adjusted under 35 U.S.C. 154(b) by 306 days.

(21) Appl. No.: 17/872,989

(22) Filed: Jul. 25, 2022

(65) Prior Publication Data

US 2024/0028059 A1 Jan. 25, 2024

(51) Int. Cl.
| | |
|---|---|
| *G05F 1/46* | (2006.01) |
| *G05F 1/56* | (2006.01) |
| *G05F 1/575* | (2006.01) |
| *H03F 3/45* | (2006.01) |
| *H03M 1/66* | (2006.01) |

(52) U.S. Cl.
CPC .............. *G05F 1/468* (2013.01); *G05F 1/561* (2013.01); *G05F 1/575* (2013.01); *H03F 3/45071* (2013.01); *H03M 1/66* (2013.01)

(58) Field of Classification Search
CPC .......... G05F 1/468; G05F 1/561; G05F 1/575; H03F 3/45071; H03M 1/66
USPC ......................................................... 323/313
See application file for complete search history.

(56) References Cited

U.S. PATENT DOCUMENTS

| | | | |
|---|---|---|---|
| 6,906,576 B2 | 6/2005 | Sivero et al. | |
| 6,989,659 B2 | 1/2006 | Menegoli et al. | |
| 8,022,681 B2 | 9/2011 | Gurcan | |
| 9,300,307 B2 | 3/2016 | Juneau et al. | |
| 9,379,727 B1* | 6/2016 | Seo ........................... | G05F 1/56 |
| 9,870,012 B2 | 1/2018 | Raychowdhury et al. | |
| 10,014,873 B1 | 7/2018 | Van Veldhoven et al. | |
| 10,019,021 B1 | 7/2018 | Lee et al. | |
| 10,627,844 B1 | 4/2020 | Ji | |
| 11,372,436 B2 | 6/2022 | Ahmed | |
| 2008/0024342 A1* | 1/2008 | Deval ..................... | H03M 3/34 |
| | | | 341/143 |

(Continued)

OTHER PUBLICATIONS

First Examination Report for Indian Patent Application No. 202314046355 dated Aug. 19, 2024; 6 pgs.

*Primary Examiner* — Yemane Mehari
(74) *Attorney, Agent, or Firm* — Fletcher Yoder, P.C.

(57) ABSTRACT

The present disclosure relates to power management for digital-to-analog converters (DACs). As electronic devices and the components therein become increasingly smaller to satisfy the desire for more compact/portable devices, the operating voltage may be reduced to reduce the likelihood of shorts and/or voltage/current bleeds. To maintain comparable power output with the reduced operating voltage, the current may increase proportionally to the decrease in voltage. Consequently, in scaled devices and applications, high-current low-voltage regulators may be beneficial. As such, a low-dropout regulator (LDO) including one or more operational amplifiers and multiple pass devices may be implemented between a power supply and the DAC to regulate the power supply to the DAC. Moreover, the LDO may include one or more feedback loops to maintain a desired voltage regulation of the pass devices.

20 Claims, 14 Drawing Sheets

(56) References Cited

U.S. PATENT DOCUMENTS

| | | | |
|---|---|---|---|
| 2010/0103014 A1* | 4/2010 | Quiquempoix | H03M 3/34 341/150 |
| 2020/0278709 A1* | 9/2020 | Azevedo | G05F 1/575 |
| 2020/0366535 A1* | 11/2020 | Yu | H04L 25/0212 |
| 2021/0111681 A1* | 4/2021 | Särkkä | H03F 3/45183 |
| 2021/0359602 A1* | 11/2021 | Ruan | H02M 1/0025 |
| 2021/0408969 A1 | 12/2021 | Bang et al. | |

\* cited by examiner

SPLIT PASS DEVICE APPLICATIONS FOR DAC SUPPLY SYSTEMS

BACKGROUND

The present disclosure relates generally to pass devices and digital-to-analog converters (DACs).

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure.

Numerous electronic devices—including televisions, portable phones, computers, wearable devices, vehicle dashboards, virtual-reality glasses, and more—utilize DACs to generate analog electrical signals from digitally coded data. For example, an electronic device may use one or more DACs to convert digital signals to analog signals for transmission via radio frequency (RF) circuitry. Additionally or alternatively, DACs may be used to drive pixels of an electronic display at specific voltages based on digitally coded image data to produce the specific luminance level outputs to display an image. As components within the electronic devices become increasingly smaller, challenges may arise due to the diminished maximum voltage allowed per-transistor.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, transmit circuitry may include a digital-to-analog converter (DAC), wherein the DAC may include a first power supply input and a second power supply input. The transmit circuitry may include power regulation circuitry, and the power regulation circuitry may include a first amplifier, a first pass device, and a second pass device. The first amplifier may be coupled to a first gate terminal of the first pass device and to a second gate terminal of the second pass device. The first pass device may include a first output coupled to the first power supply input, and the second pass device may include a second output coupled to the second power supply input.

In another embodiment, a system may include a digital-to-analog converter (DAC) that may include a first power input and a second power input. The system may include a first amplifier that may receive a reference voltage and regulate a voltage output of the first amplifier based at least in part on the reference voltage. The system may include a first pass device, comprising a first gate terminal coupled to the first amplifier and a first output terminal coupled to the first power input of the DAC, the first pass device may output a first power via the first output terminal based at least in part on the voltage output of the first amplifier. The system may include a second amplifier that may regulate the voltage output of the first amplifier based at least in part on the first power and a second pass device that may include a second gate terminal coupled to the first amplifier and a second output terminal coupled to the second power input of the DAC, the second pass device may output a second power via the second output terminal based at least in part on the voltage output of the first amplifier. The system may include a third amplifier that may regulate the voltage output of the first amplifier based at least in part on the second power.

In yet another embodiment, a method may include generating, via a first amplifier, a pass device regulation signal based at least in part on a reference signal. The method may include regulating a power signal through a first pass device regulation signal and regulating the power supply through a second pass device to generate a second DAC input supply based at least in part on the pass device regulation signal. The method may include providing, via a second amplifier, a first gain regulation to the pass device regulation signal at a first adder based at least in part on the first DAC supply and providing, via a third amplifier, a second gain regulation to the pass device regulation signal at a second adder based at least in part on the second DAC input supply. The method may include providing, via the first amplifier, a third regulation to the pass device regulation signal based at least in part on the first DAC input supply, the second DAC input supply, or a combination thereof received at a differential port of the first amplifier. The method may also include providing the first DAC input supply and the second DAC input supply to a DAC.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
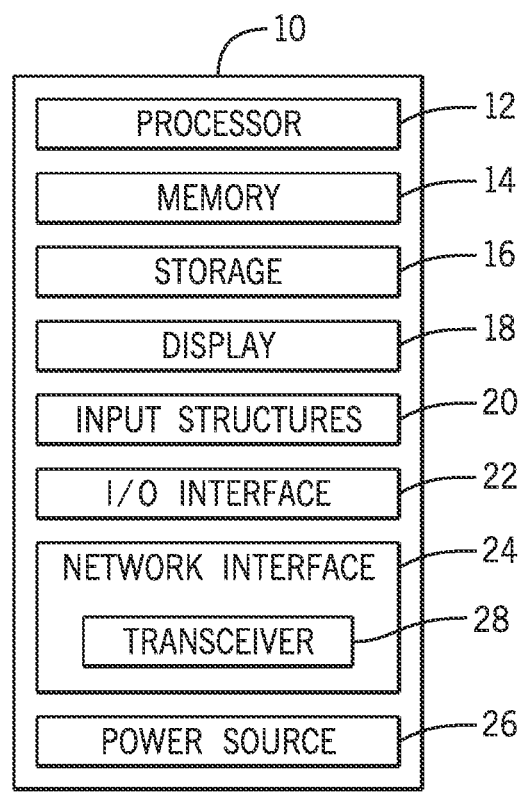
FIG. 1 is a block diagram of an electronic device, according to embodiments of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on.

The present disclosure relates to pass devices and digital-to-analog conversion. In particular, the present disclosure relates to power management for digital-to-analog converters (DACs) (e.g., having a column-and-line or fractal layout) such as those used in radio frequency (RF) communications (e.g., cellular communications), as well as other components within electronic devices. Electronic devices and/or the components therein are becoming increasingly smaller to satisfy the desire for more compact/portable devices. However, as components (e.g., transistors, conductors, etc.) are scaled to smaller sizes, the operating voltage may be reduced to reduce the likelihood of shorts and/or voltage/current bleeds. This may be particularly the case at an output stage of the DAC. To maintain comparable power output with the reduced operating voltage, the current (e.g., from a power supply) may be increased (i.e., according to the principle P=VI, where P is power supplied to the circuit, V is the voltage (i.e., the potential difference) in the circuit, and I is the current. Assuming constant power, as voltage is reduced, current increases proportionally. Consequently, in highly-scaled devices and applications, high-current low-voltage regulators may be beneficial.

High-current low-voltage regulation may be provided by a circuit including a power management unit (PMU), a buck converter, and a low-drop out regulator (LDO). An LDO may include a circuit wherein a pass device (e.g., an n-channel metal oxide semiconductor (nMOS) field-effect transistor or a p-channel metal oxide semiconductor (pMOS) field-effect transistor) may be disposed between a power supply (e.g., a supply voltage) and an electrical load to isolate the LDO from a noisy power supply and provide fine-grain direct current (DC) regulation. The pass device may be coupled to an error amplifier (e.g., an operational transconductance amplifier (OTA)) to regulate the power supply to the DAC. Moreover, the LDO may include circuitry to provide low-frequency high-gain regulation (e.g., via "slow" feedback loop) and high-frequency low-gain regulation (e.g., via "fast" feedback loop) to the DAC.

To reduce the size of the components (e.g., one or more pass devices) while still maintaining power handling capabilities, it may be advantageous to couple multiple LDOs (e.g., 2 LDOs, 4 LDOs, and so on) to the DAC, thus splitting the voltage regulation between the multiple LDOs and splitting the current handled by any one pass device. Splitting the regulation may also yield benefits for DACs utilizing multiphase elements. For example, in the case of a system utilizing multiphase signals (e.g., an in-phase signal (i.e., I signal), a phase-shifted (e.g., shifted by 90 degrees compared to the in-phase signal) "quadrature" signal (i.e., Q signal), and/or the inverses thereof), utilizing multiple independently-controlled LDOs may enable splitting the I and Q associated loads of the DAC across the independently-controlled LDOs.

One advantage of splitting the power supply (e.g., supply voltage) regulation across the I and Q loads (e.g., regulating power for I and Q independently, in contrast to using a shared I and Q power source) may include greater ease of applying pre-distortion to the multiphase signals. For example, greater linearity may be achieved by applying independent pre-distortion algorithms to the I and Q signals separately, rather than developing a single, complex I/Q pre-distortion algorithm. Splitting the I and Q power sources may also mitigate crosstalk between the I and Q sources, such that an error on the I signal does not affect the Q signal and vice versa. In contrast, when using a shared IQ supply, an error on either the I or Q signal may affect both the Q and I signals).

While implementing multiple LDOs for a DAC may reduce the current handled by any one pass device, thus, enabling smaller pass devices to be utilized, implementing multiple error amplifiers (e.g., OTAs) may consume excess space and/or lead to a higher combined peak current when implemented independently. Thus, in some embodiments, one LDO may be coupled to the DAC, the LDO including one error amplifier that feeds two high-gain low-frequency feedback loops and two low-gain high-frequency feedback loops to regulate power to respective sides (e.g., the I loads and Q loads) of the DAC. Using such a topology, the single error amplifier feeding multiple pass devices that split the regulation of the loads (e.g., I and Q loads and/or different geometrically positioned loads) of the DAC may provide an effective voltage regulation to the DAC while utilizing smaller pass devices. Additionally, implementing one LDO with multiple pass devices may leverage the benefits of splitting the I and Q loads and that of a shared IQ supply. For example, one LDO with multiple pass devices regulating the DAC may provide a more effective overall regulation with lower overall error, while still reducing cross talk between the I and Q supplies and facilitating less complex pre-distortion, among other advantages.

With the foregoing in mind, FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 20, an input/output (I/O) interface 22, a network interface 24, and a power source 26. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 20, the input/output (I/O) interface 22, the network interface 24, and/or the power source 26 may each be communicatively coupled directly or indirectly (e.g., through or via another component, a communication bus, a network) to one another to transmit and/or receive data between one another. It should be noted that FIG. 1 is merely one example of a particular implementation and is intended to illustrate the types of components that may be present in electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices. It should be noted that the processor 12 and other related items in FIG. 1 may be generally referred to herein as "data processing circuitry." Such data processing circuitry may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 20 of the electronic device 10 may enable a user to interact with the electronic device 10 (e.g., pressing a button to increase or decrease a volume level). The I/O interface 22 may enable electronic device 10 to interface with various other electronic devices, as may the network interface 24. In some embodiments, the I/O interface 22 may include an I/O port for a hardwired connection for charging and/or content manipulation using a standard connector and protocol, such as the Lightning connector provided by Apple Inc. of Cupertino, California, a universal serial bus (USB), or other similar connector and protocol. The network interface 24 may include, for example, one or more interfaces for a personal area network (PAN), such as an ultra-wideband (UWB) or a BLUETOOTH® network, for a local area network (LAN) or wireless local area network (WLAN), such as a network employing one of the IEEE 522.11x family of protocols (e.g., WI-FI®), and/or for a wide area network (WAN), such as any standards related to the Third Generation Partnership Project (3GPP), including, for example, a 3rd generation (3G) cellular network, universal mobile telecommunication system (UMTS), 4th generation (4G) cellular network, long term evolution (LTE®) cellular network, long term evolution license assisted access (LTE-LAA) cellular network, 5th generation (5G) cellular network, and/or New Radio (NR) cellular network, a satellite network, and so on. In particular, the network interface 24 may include, for example, one or more interfaces for using a Release-15 cellular communication standard of the 5G specifications that include the millimeter wave (mmWave) frequency range (e.g., 22.25-300 gigahertz (GHz)) and/or any other cellular communication standard release (e.g., Release-16, Release-17, any future releases) that define and/or enable frequency ranges used for wireless communication. The network interface 24 of the electronic device 10 may allow communication over the aforementioned networks (e.g., 5G, Wi-Fi, LTE-LAA, and so forth).

The network interface 24 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 24 may include a transceiver 28. In some embodiments, all or portions of the transceiver 28 may be disposed within the processor 12. The transceiver 28 may support transmission and receipt of various wireless signals via one or more antennas, and thus may include a transmitter and a receiver. The power source 26 of the electronic device 10 may include any suitable source of power, such as a rechargeable lithium polymer (Li-poly) battery and/or an alternating current (AC) power converter. In certain embodiments, the electronic device 10 may take the form of a computer, a portable electronic device, a wearable electronic device, or other type of electronic device.

Figure 2:
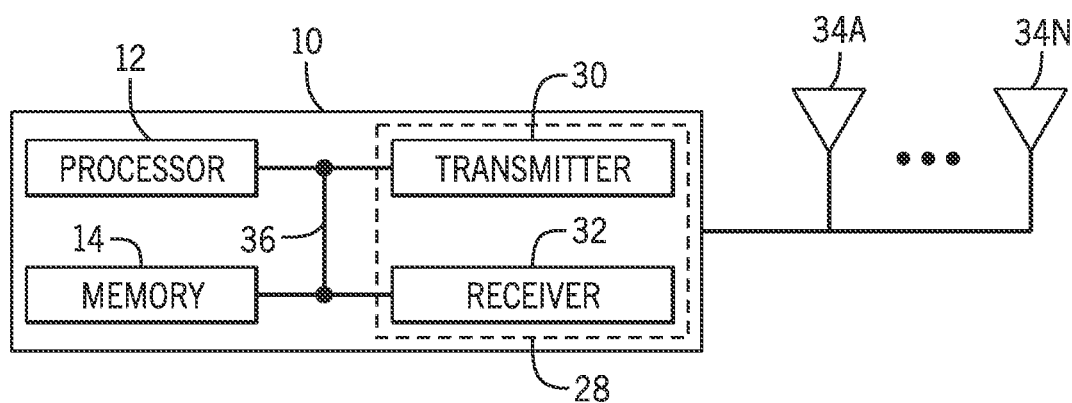
FIG. 2 is a schematic diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 28, a transmitter 30, a receiver 32, and/or antennas 34 (illustrated as 34A-34N, collectively referred to as an antenna 34) may be communicatively coupled directly or indirectly (e.g., through or via another component, a communication bus, a network) to one another to transmit and/or receive data between one another.

The electronic device 10 may include the transmitter 30 and/or the receiver 32 that respectively enable transmission and reception of data between the electronic device 10 and an external device via, for example, a network (e.g., including base stations) or a direct connection. As illustrated, the transmitter 30 and the receiver 32 may be combined into the transceiver 28. The electronic device 10 may also have one or more antennas 34A-34N electrically coupled to the transceiver 28. The antennas 34A-34N may be configured in an omnidirectional or directional configuration, in a single-beam, dual-beam, or multi-beam arrangement, and so on. Each antenna 34 may be associated with a one or more beams and various configurations. In some embodiments, multiple antennas of the antennas 34A-34N of an antenna group or module may be communicatively coupled a respective transceiver 28 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 30 and the receiver 32 may transmit and receive information via other wired or wireline systems or means.

As illustrated, the various components of the electronic device 10 may be coupled together by a bus system 36. The bus system 36 may include a data bus, for example, as well as a power bus, a control signal bus, and a status signal bus, in addition to the data bus. The components of the electronic device 10 may be coupled together or accept or provide inputs to each other using some other mechanism.

Figure 3:
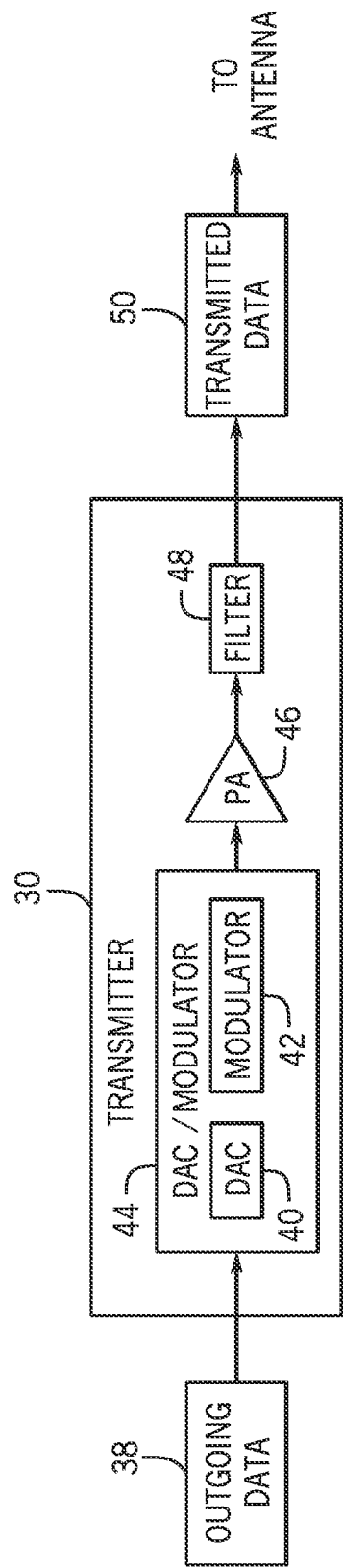
FIG. 3 is a schematic diagram of a transmitter of the electronic device of FIG. 1, according to embodiments of the present disclosure.

FIG. 3 is a schematic diagram of the transmitter 30 (e.g., transmit circuitry), according to embodiments of the present disclosure. As illustrated, the transmitter 30 may receive outgoing data 38 in the form of a digital signal to be transmitted via the one or more antennas 34. A digital-to-analog converter (DAC) 40 of the transmitter 30 may convert the digital signal to an analog signal, and a modulator 42 may combine the converted analog signal with a carrier signal to generate a radio wave. Additionally or alternatively, the DAC 40 and modulator 42 may be implemented together in a DAC/modulator 44. For example, the DAC/modulator 44 may convert the digital signal to the analog signal and combine the converted analog signal with the carrier signal simultaneously or concurrently and/or within the same circuitry. Moreover, the DAC/modulator 44 may be implemented as multiple circuits (e.g., DAC 40 and modulator 42) coupled together or a singular combined circuit. In some embodiments, the DAC/modulator 44 may directly generate a modulated analog signal without first generating the converted analog signal. Furthermore, as used herein, a DAC 40 may refer to a standalone DAC 40 or a combined DAC/modulator 44, and an analog signal may refer to a converted analog signal or a modulated analog signal. Additionally, while embodiments are described herein as applying to RF signal generation, in some embodiments, aspects of the present disclosure may be applicable to other types or utilizations of DACs, such as a baseband DAC.

A power amplifier (PA) 46 receives the modulated signal from the modulator 42. The power amplifier 46 may amplify the modulated signal to a suitable level to drive transmission of the signal via the one or more antennas 34. A filter 48 (e.g., filter circuitry and/or software) of the transmitter 30 may then remove undesirable noise from the amplified signal to generate transmitted data 50 to be transmitted via the one or more antennas 34. The filter 48 may include any suitable filter or filters to remove the undesirable noise from the amplified signal, such as a bandpass filter, a bandstop filter, a low pass filter, a high pass filter, and/or a decimation filter. Additionally, the transmitter 30 may include any suitable additional components not shown, or may not include certain of the illustrated components, such that the transmitter 30 may transmit the outgoing data 38 via the one or more antennas 34. For example, the transmitter 30 may include a mixer and/or a digital up converter. As another example, the transmitter 30 may not include the filter 48 if the power amplifier 46 outputs the amplified signal in or approximately in a desired frequency range (such that filtering of the amplified signal may be unnecessary).

Figure 4:
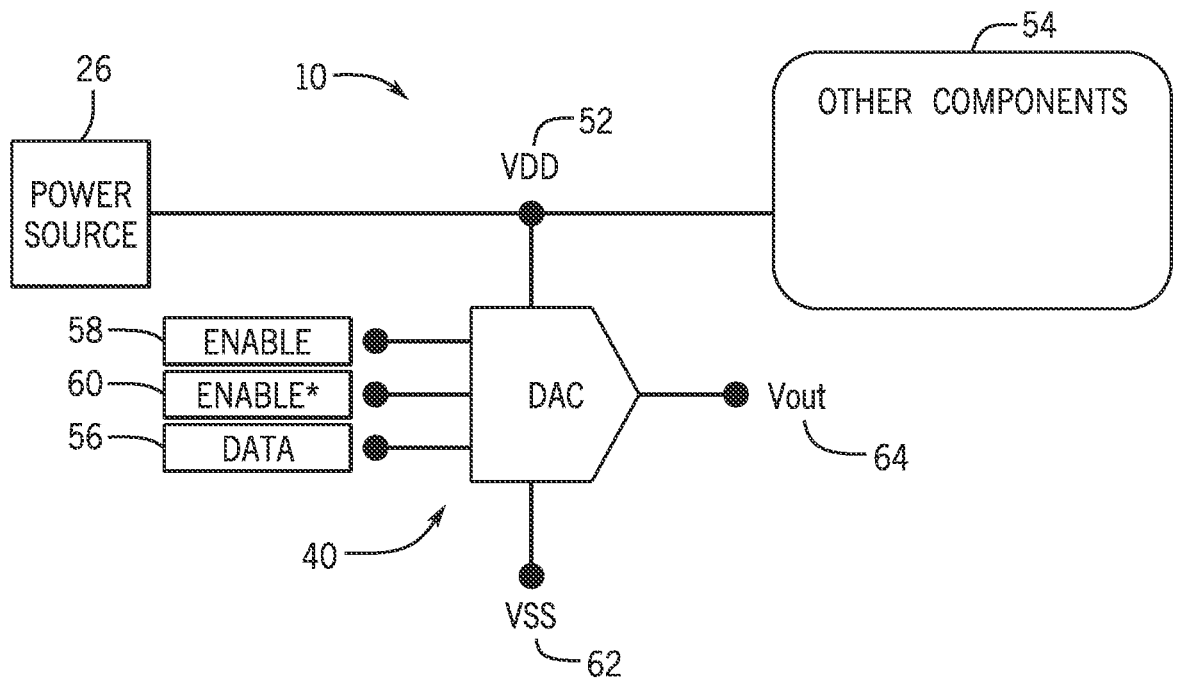
FIG. 4 is a schematic diagram of a portion of the electronic device of FIG. 1 including a digital-to-analog converter (DAC) of the transmitter of FIG. 3, in accordance with an embodiment of the present disclosure.

FIG. 4 is a schematic diagram of a portion of the transmitter 30 of the electronic device having a DAC 40, according to an embodiment of the present disclosure. In some embodiments, the DAC 40 may share a supply or positive power voltage (e.g., VDD) 52 provided by the power source 26 with other components 54 of the transmitter 30 and/or the electronic device 10. For example, the other components 54 may include any powered electronic component of the transmitter 30 and/or the electronic device 10 utilizing the supply voltage 52 or a derivative thereof. Moreover, the DAC 40 may receive a digital signal 56 (e.g., of outgoing data 38), an enable signal 58, and/or a complementary enable signal 60. The enable signal 58 and/or the complementary enable signal 60 may enable and/or facilitate enabling operation of the DAC 40. For example, if the enable signal 58 is logically "low" relative to a reference voltage 62 (e.g., ground or other relative voltage), then the DAC 40 may be disabled or inactive (e.g., in a disable, inactive, or deactivated state). On the other hand, if the enable signal 58 is logically "high" (e.g., relative to the reference voltage 62 and/or the supply voltage 52), then the DAC 40 may be enabled or active for operation (e.g., in an enabled or activated state). Furthermore, the reference voltage 62 (e.g., VSS) may be provided as a reference for the digital signal 56, the enable signal 58, the complementary enable signal 60, the supply voltage 52, and/or the analog output signal 64. As should be appreciated, and as used herein, signals (e.g., the digital signal 56, the enable signal 58, the complementary enable signal 60, the analog output signal 64, etc.) may correspond to voltages and/or currents relative to a reference and may represent electronically storable, displayable, and/or transmittable data.

As discussed herein, the different analog output signals 64 generated by the DAC 40 may correspond to values of the digital signal 56. The digital signal 56 and corresponding analog output signal 64 may be associated with any suitable bit-depth depending on implementation. For example, in the context of image data (e.g., in a baseband DAC) and/or signal transmission data (e.g., in an RF DAC), an 8-bit digital signal 56 may correspond to 255 or 256 analog output signals 64.

Figure 5:
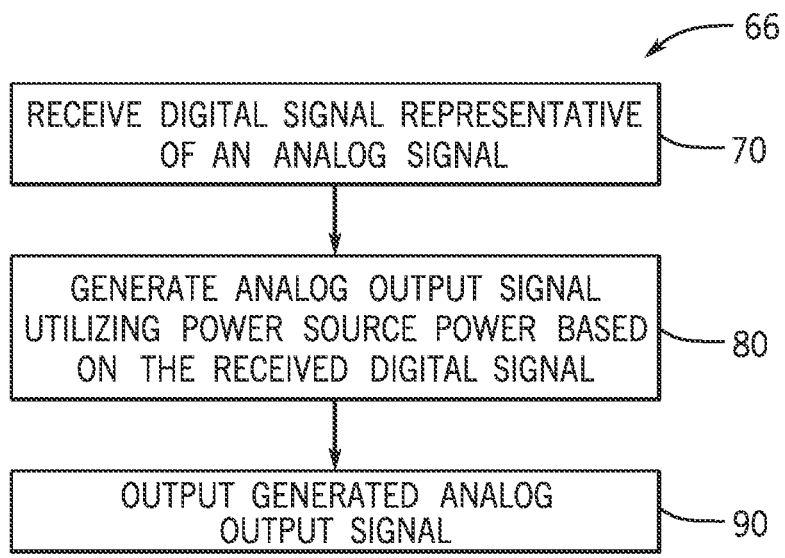
FIG. 5 is a flowchart of a method for converting a digital signal to an analog signal using the DAC of FIG. 4, in accordance with an embodiment of the present disclosure.

FIG. 5 is a flowchart of a method 66 for converting a digital signal to an analog signal using the DAC 40, according to an embodiment of the present disclosure. In general, the DAC 40 may receive a digital signal 56 representative of an analog signal (process block 70). The DAC 40 may also generate an analog output signal 64 (as discussed in further detail below), utilizing power from the power source 26, based on the received digital signal 56 (process block 80). The generated analog output signal 64 may then be output from the DAC 40 (processing block 90).

Figure 6:
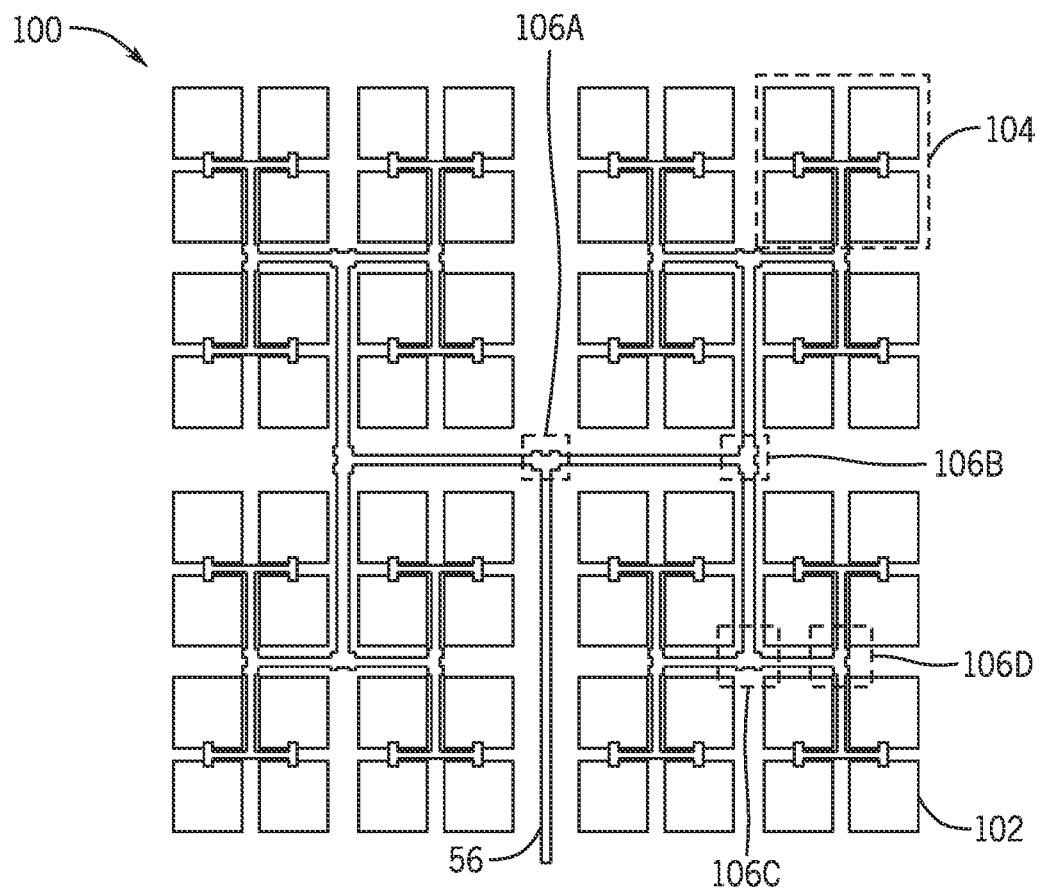
FIG. 6 is a schematic diagram of a fractal DAC, in accordance with an embodiment of the present disclosure.

As discussed above, the DAC 40 may generate an analog output signal 64 by enabling one or more unit cells to output a unit amount of current or voltage that, in the aggregate, form the analog output signal 64. The unit current or voltage may be predetermined and based on implementation factors. For example, the unit cells may include one or more capacitors that store a fixed amount of charge that may be released to form the analog output signal 64. In some scenarios, the physical and/or logical layout of the unit cells may affect the speed of operation of the DAC 40 and/or the linearity of the DAC 40. As such, in some embodiments, one or more DACs 40 of the electronic device 10 may be implemented as a fractal DAC 100, as illustrated in FIG. 6. A fractal DAC 100 may include multiple unit cells 102 arranged (e.g., logically and/or physically) in a fractal pattern constructed of fractal blocks 104. Moreover, the illustrated pattern may be replicated by replacing each unit cell 102 with a fractal block 104 to realize a fractal DAC of increased size while maintaining symmetry.

In the illustrated example, the fractal DAC 100 includes sixteen fractal blocks 104 of four unit cells 102, which may correspond to, for example, sixty-four different analog output signals 64 (e.g., which may have non-zero values). However, larger fractal DACs may be envisioned by replacing each unit cell 102 with a fractal block 104, increasing the size of the fractal DAC 100 by four each time to maintain 4× unit cells 102 (where x is the number of fractal block recursions in the fractal DAC 100). As should be appreciated, the size of the fractal DAC 100 may depend on implementation factors such as desired granularity of the analog output signal 64. Furthermore, different size fractal blocks 104 (e.g., half of a fractal block 104) may be used to achieve different numbers of total unit cells 102 (e.g., 2× number of unit cells 102 for fractal blocks 104 having a size of two unit cells 102). Moreover, in some embodiments, one or more unit cells 102 may be representative of fractional unit cells (e.g., outputting 0.5 or 0.25 of a unit voltage or current) to further increase granularity, dynamic range extension, and/or as an offset to decrease differential non-linearity (DNL) and/or integral nonlinearity (INL).

In some embodiments, the multiple nested fractal blocks 104 may be continuously/recursively split into symmetrical branches by decision units 106 (e.g., 106A, 106B, 106C, 106D, etc.) until reaching the unit cells 102. That is, for a given branch of the fractal DAC 100, sequential decision units 106 may be used to interpret and decode the digital signal 56 and direct enable/disable signals to the corresponding unit cells 102 to generate the analog output signal 64. Additionally, although the digital signal 56 is depicted as a single line, in some embodiments, the digital signal 56 may include multiple data buses running in parallel through the fractal DAC 100. For example, the multiple data buses may include data for multiple phases and/or polarity (e.g., negative and positive). As such, the fractal DAC 100 and the decision units 106 may operate using multiple digital signals 56 in parallel to control outputs of the unit cells 102.

Figure 7:
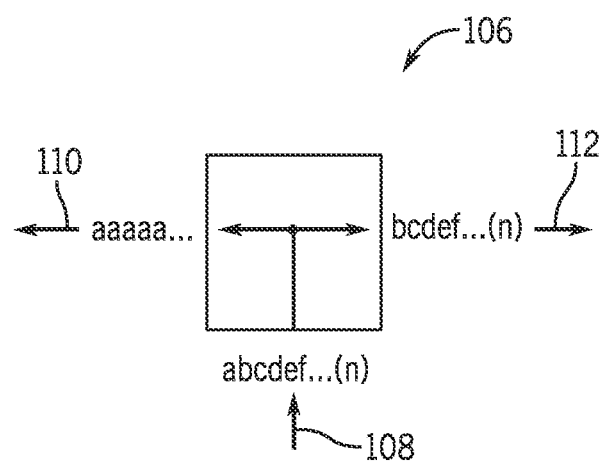
FIG. 7 is a schematic diagram of a decision unit of the fractal DAC of FIG. 6, in accordance with an embodiment of the present disclosure.

To help illustrate, FIG. 7 is an example decision unit 106 receiving an incoming signal 108 of n bits, according to an embodiment of the present disclosure. In some embodiments, the incoming signal 108 (e.g., the digital signal 56) is a binary signal that is decoded step-by-step by the sequential decision units 106, such that the aggregate of the signals reaching the unit cells 102 forms a thermometric signal. For example, the aggregate thermometric signal for a binary incoming signal 108 of "10" may be represented as "0011." As the decision units 106 decipher and pass on certain portions of the incoming signal 108 along different routes, the unit cells 102 may eventually end up with respective portions of the thermometric digital signal (e.g., with logical "1" or high going to two unit cells 102 for activation and logical "0" or low going to two different unit cells 102 for deactivation). For example, the incoming signal 108 may have n-bits (e.g., abcdef . . . n, where each letter is representative of a logical value in a binary format, as in the illustrated example). Each decision unit 106 may take the most significant bit (MSb) of the incoming signal 108, repeat it n−1 times, and output a MSb signal 110 having the MSb of the incoming signal 108 repeated n−1 times. Additionally, the decision unit 106 may output a least significant bit (LSb) signal 112 including the remainder of the incoming signal 108, without the MSb, having n−1 total bits.

As should be appreciated, the MSb of a binary signal is representative of half of the value of the incoming signal 108. As such, if the MSb (e.g., at decision unit 106A) is a logical "1", the repeated logical "1" will be propagated down half of the branches of the fractal DAC 100, reducing the bit-depth by one with each subsequent decision unit 106, to enable half of the unit cells 102 downstream from the initial decision unit 106 (e.g., decision unit 106A). The remaining half of the unit cells 102 may be enabled or disabled according to the LSb signal 112 having the remainder of the incoming signal 108. Using similar logic, the LSb signal 112 from an initial decision unit 106 (e.g., decision unit 106A) may be the incoming signal 108 for a subsequent decision unit 106 (e.g., decision unit 106B) and so forth. Furthermore, while depicted as outputting the MSb signal 110 to the left and the LSb signal 112 to the right, decision units 106 may output the LSb signal 112 and MSb signal 110 in either direction according to a fill order (e.g., an order of increasing activations of unit cells 102) of the fractal DAC 100, which may be programmable. Moreover, in some embodiments, a remainder bit may be added to the digital signal 56 prior to the fractal DAC 100 or added to the MSb signal 110 and/or LSb signal 112 at the first decision unit 106 (e.g., decision unit 106A) based on the digital signal 56 to facilitate decoding from a binary digital signal to a thermometric digital signal (e.g., at the unit cells 102).

Additionally, although depicted in FIGS. 6 and 7 as having two outputs (e.g., MSb signal 110 and LSb signal 112), in some embodiments, the decision units 106 may evaluate multiple bits of the incoming signal 108 at the same time (e.g., simultaneously or concurrently). For example, a decision unit 106 may provide four outputs in a quaternary split of the incoming signal 108, effectively combining the efforts of the first two levels of decision units 106 (e.g., decision unit 106A, decision unit 106B, and the decision unit opposite decision unit 106B). In the example of the quaternary split, two outputs may include the MSb signal 110 with a bit depth of n−2, a signal of repeated entries of the second MSb with a bit depth of n−2, and the LSb signal 112 with a bit depth of n−2, having the 2 MSbs removed. As should be appreciated, the number of splits for a single decision unit 106 may vary based on implementation. Furthermore, in some embodiments, the decision units 106 may include multiple incoming signals 108, for example from multiple parallel data buses, and provide either a binary split, a quaternary split, or other split to each incoming signal 108.

As discussed above, the fractal DAC 100 may facilitate decoding of the digital signal 56 (e.g., via the decision units 106) into a thermometric signal dispersed among the unit cells 102. Additionally or alternatively, the digital signal 56 may include a binary signal that is not decoded via the decision units 106. For example, some unit cells 102 may have a binary-sized output that is dependent upon a binary signal. In some embodiments, the binary signal (e.g., a portion of or separate from the digital signal 56) may traverse the same path as the decoded thermometric signal and therefore have substantially similar arrival time at the binary coded unit cells 102, maintaining synchronicity of the fractal DAC 100. For example, the binary signal may be passed through or bypass the decision units 106 and/or use separate distribution logic following the data path of the fractal DAC 100. The binary coded unit cells 102 may use the binary signal to vary the output between zero (e.g., disabled) and a full unit voltage or current (e.g., 0.0, 0.25, 0.5, 0.75, or 1.0 of a unit voltage or current). For example, the binary coded unit cell 102 may include binary interpretation logic to decode the binary signal and enable the binary coded unit cell 102 at an intermediate power level (e.g., 0.25, 0.5, or 0.75 of a unit voltage or current). The binary-sized output of the binary coded unit cells 102 may facilitate increasing resolution of the analog output signal 64 by providing increased granularity.

Figure 8:
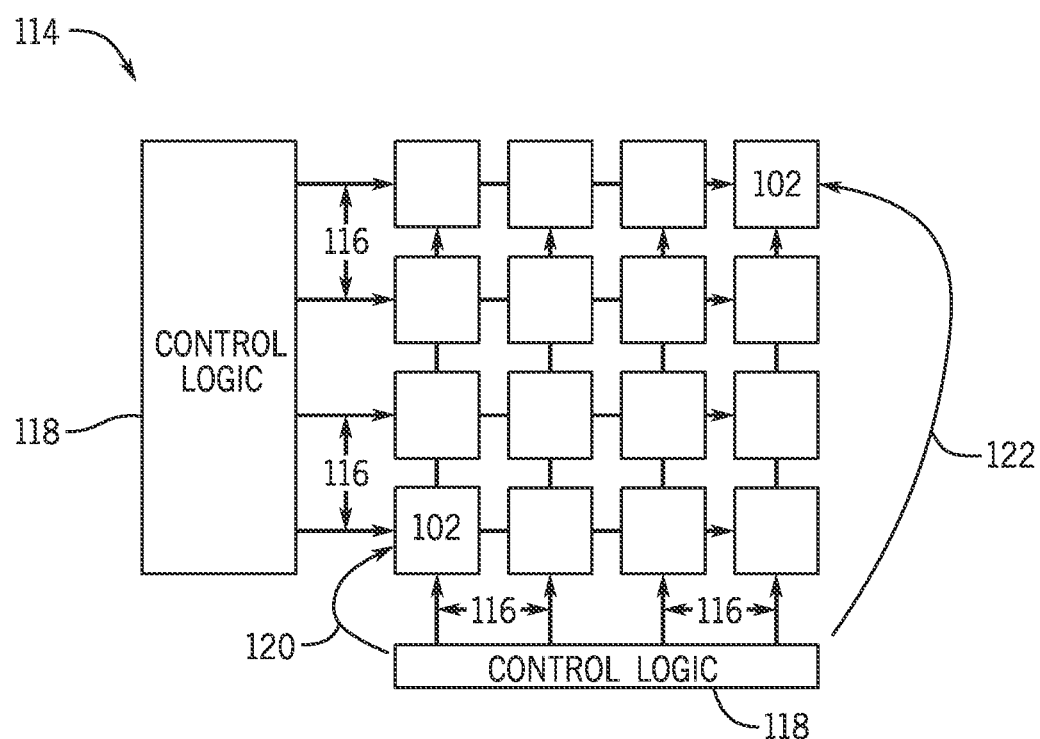
FIG. 8 is a schematic diagram of a column and line DAC, in accordance with an embodiment of the present disclosure.

In some embodiments, the DAC 40 or the DAC/modulator 44 may include a DAC other than the fractal DAC 100, such as a column and line DAC 114 shown in FIG. 8. In some scenarios, the column and line DAC 114 may include a multitude of control signals 116 from control logic 118 feeding an array of unit cells 102. For example, the control logic 118 of the column and line DAC 114 may incorporate binary to thermometric conversion and/or take into consideration the desired states of multiple individual unit cells 102 concurrently or simultaneously to determine control signals 116 necessary for operation.

The fractal DAC 100 may include data paths (physically and/or logically) to each unit cell 102 that are substantially of the same dimensions, components, and/or number of components, which may further increase linearity and/or synchronicity. For example, returning briefly to FIG. 6, starting from the incoming digital signal 56 and the first decision unit 106A, the data path to each unit cell 102 and the number of decision units 106 traversed along the data path is the same for each unit cell 102. In other words, a fractal DAC 100 may include data paths that are substantially the same, innately providing the decoded incoming signal 108 to each of the unit cells 102 concurrently or at substantially the same time. As should be appreciated, in some embodiments, some data paths of a fractal DAC 100 may differ due to manufacturing tolerances, physical layout constraints, data-line-to-data-line coupling, and/or additional implementation factors and interference. The substantially similar data paths of the fractal DAC 100 may reduce or eliminate a wait time associated with the difference between shorter and longer data paths (e.g., the difference between data path 120 and data path 122 in a column and line DAC 114), further increasing the operable speed of the fractal DAC 100. As discussed above, the decision units 106 may recursively split the digital signal 56, at each level of decision unit(s) 106, and output an MSb signal 110 and an LSb signal 112 to different branches of the fractal DAC 100. As used herein, the "level" of a decision unit 106 may refer to how many decision units 106 have been traversed by the digital signal 56. For example, referring back to FIG. 6, decision unit 106A may be considered to be at level one, decision unit 106B may be considered to be at level two, and so on.

Figure 9:
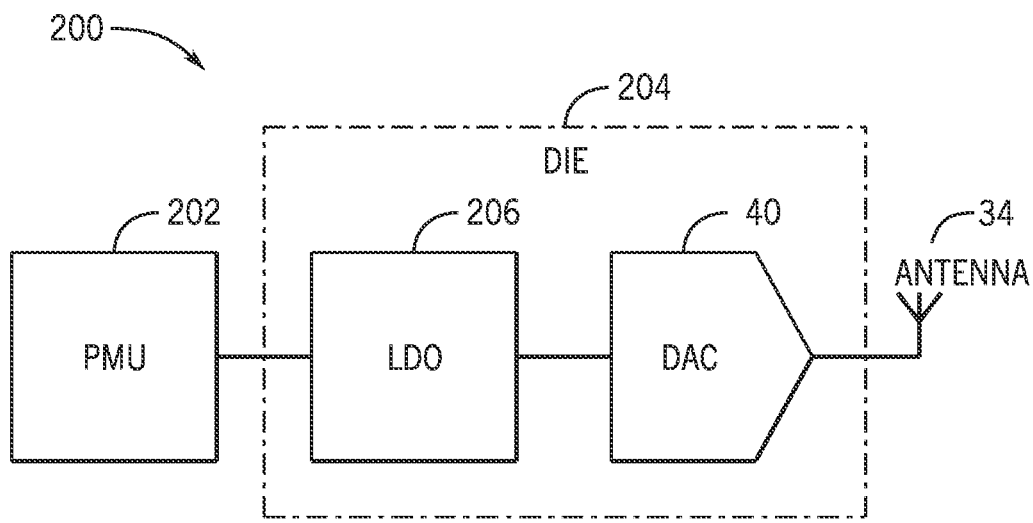
FIG. 9 is a schematic diagram of a power supply regulation system for a DAC (e.g., the fractal DAC of FIG. 6 or the column and line DAC of FIG. 8), in accordance with an embodiment of the present disclosure.

As discussed herein, a power supply (e.g., supply voltage) regulation system 200 may be used to provide power to any suitable type of DAC 40 (e.g., the fractal DAC 100 or the column and line DAC 114), as shown in the block diagram of FIG. 9. The power supply regulation system 200 may include an off-die power management unit (PMU) 202 (e.g., implemented on a printed circuit board (PCB) rather than on a die 204 with the DAC 40) that supplies power to the DAC 40 (e.g., a radio frequency DAC implemented as the fractal DAC 100 or the line and column DAC 114). However, in some cases the PMU 202 may be a substantial distance from the DAC 40, and thus the supply signal supplied by the PMU 202 to the DAC 40 may become noisy and/or may experience a phase error or voltage error (e.g., voltage drop) prior to reaching the DAC 40. Moreover, in some scenarios, the DAC 40 may be susceptible to power supply variations (e.g., having a reduced power supply rejection ratio). As such, it may be desirable to implement a voltage regulator (e.g., a low dropout (LDO) 206 regulator) relatively close (e.g., on the die 204 with the DAC 40) to the DAC to provide finer-grain voltage regulation to the supply signal prior to the supply signal reaching the DAC 40. Using the regulated supply signal, the DAC 40 may then convert a digital signal 56 to an analog output signal 64 and send the analog output signal 64 to the antenna 34 to be transmitted to one or more destinations.

Figure 10:
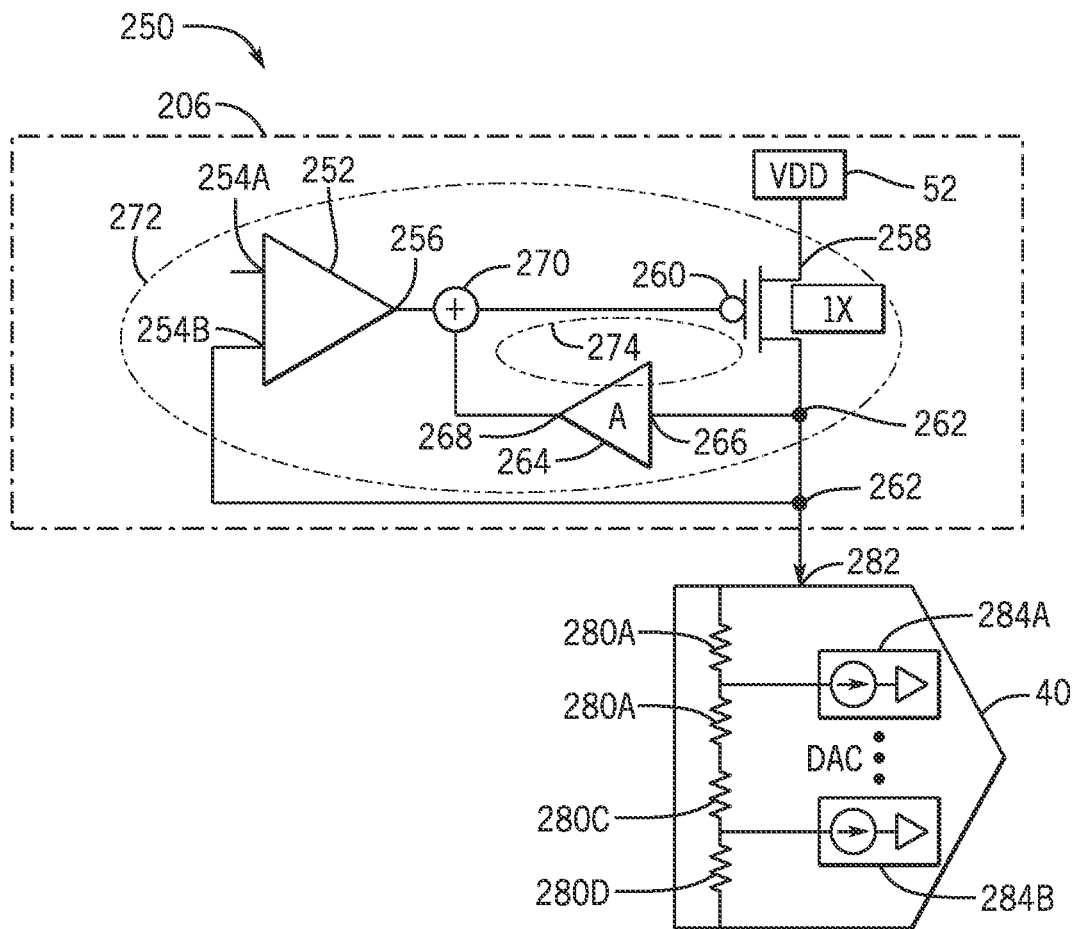
FIG. 10 is a schematic diagram of a supply regulation circuit, in accordance with an embodiment of the present disclosure.

To help illustrate, FIG. 10 is a schematic diagram of a supply regulation circuit 250 for the DAC 40 including an LDO 206. The supply regulation circuit 250 may include an LDO 206 disposed between the power source (e.g., the PMU 202) and the DAC 40 to reduce or eliminate undesired effects such as signal interference, voltage error, phase error, and so on. The DAC 40 may include a resistive mesh represented by resistors 280A, 280B, 280C, and 280D (collectively resistive mesh 280) and electrical loads 284A and 284B (collectively 284) coupled through the resistive mesh. The resistive mesh 280 may be representative of internal supply routing and/or other parasitic resistance associated with providing an input supply 282 to the electrical loads 284 of the DAC 40. The electrical loads 284 may, in some embodiments, include switched capacitors (e.g., unit cells 102) or other components of the DAC 40. Moreover, while two electrical loads 284 (e.g., electrical load 284A and electrical load 284B) are shown in FIG. 10, it should be appreciated that there may be any suitable number (e.g., 2 or more, 16 or more, 50 or more, 64 or more, 100 or more, 128 or more, 1024 or more, and so on) of electrical loads 284 depending on implementation. In some embodiments, the input supply 282 to the DAC 40 may be provided from a single side (e.g., physically and/or logically with respect to multiple phases). However, in some scenarios, the electrical loads 284 may be disposed at different points within the resistive mesh 280 such that a voltage drop across the resistive mesh 280 leads to a higher voltage at the electrical load 284A at the electrical load 284B.

The LDO 206 may include an error amplifier 252 (e.g., an operational transconductance amplifier (OTA)), having differential input ports 254A and 254B and an output port 256. As should be appreciated, although discussed herein as an error amplifier, any suitable differential amplifier or regulating amplifier may be used. The output port 256 of the error amplifier 252 may be coupled to a gate terminal 260 of a pass device 258, such that the output voltage of the error amplifier 252 (e.g., a pass device regulation signal) may, at least in part, control the gate voltage (VGs) of the pass device 258. While the pass device 258 is illustrated as a p-channel metal oxide semiconductor field-effect transistor (pMOS), it should be noted that the pass device 258 may include an n-channel metal oxide semiconductor field-effect transistor (nMOS), or any suitable voltage controlled (e.g., via the pass device regulation signal) current or voltage source.

The LDO 206 may also include an amplifier 264 coupled between an output terminal 262 of the pass device 258 and the gate terminal 260 of the pass device 258, such that an input port 266 of the amplifier 264 is coupled to the output terminal 262 of the pass device 258 and the output port 268 of the amplifier 264 is coupled to the gate terminal 260 of the pass device 258 (e.g., via an adder 270). For example, the adder 270 may be coupled between the output port 268 of the error amplifier 252 and the gate terminal 260 of the pass device 258 such that the output of the amplifier 264 and the output of the error amplifier 252 are summed at the adder 270 and the summed outputs may control the gate voltage of the pass device 258.

In some embodiments, the topology of the LDO 206 may produce one or more feedback loops such as a slow loop 272 and a fast loop 274. Utilizing multiple feedback loops may assist in providing balanced gain regulation. For example, while certain amplifiers (e.g., the error amplifier 252) may be able to provide sufficient gain regulation at certain frequencies (e.g., lower frequencies), they may be unable to provide sufficient gain for supply signals at higher frequencies, as discussed further below. Other amplifiers (e.g., amplifier 264) on the other hand, may provide modest gain for the high frequency supply signals (e.g., via the fast loop 274) to supplement the gain provided by the error amplifier 252 in the slow loop 272. Furthermore, in some embodiments, the fast loop 274 may be positioned near the pass device 258 to reduce the likelihood of error (e.g., phase error) at the gate terminal 260 of the pass device 258.

The supply signal (e.g., regulated from the source voltage VDD 52 and output from the pass device 258) may be utilized in the slow loop 272 by looping back to a differential input port 254B of the error amplifier 252 to provide feedback for the error amplifier 252 to regulate the output voltage (e.g., the pass device regulation signal) of the error amplifier 252. Additionally, the supply signal may be used in the fast loop 274 by looping back to the amplifier 264 such that the amplifier 264 provides regulation to the pass device regulation signal via the adder 270. As such, it may be appreciated that the supply signal at the output terminal 262 of the pass device 258 may alter the output signal at the output port 256 of the error amplifier 252 and the output port 268 of the amplifier 264 (which may be combined via the adder 270) and, consequently, alter the pass device regulation signal received at the gate terminal 260 of the pass device 258, thus providing responsive voltage regulation to the DAC 40.

Figure 11:
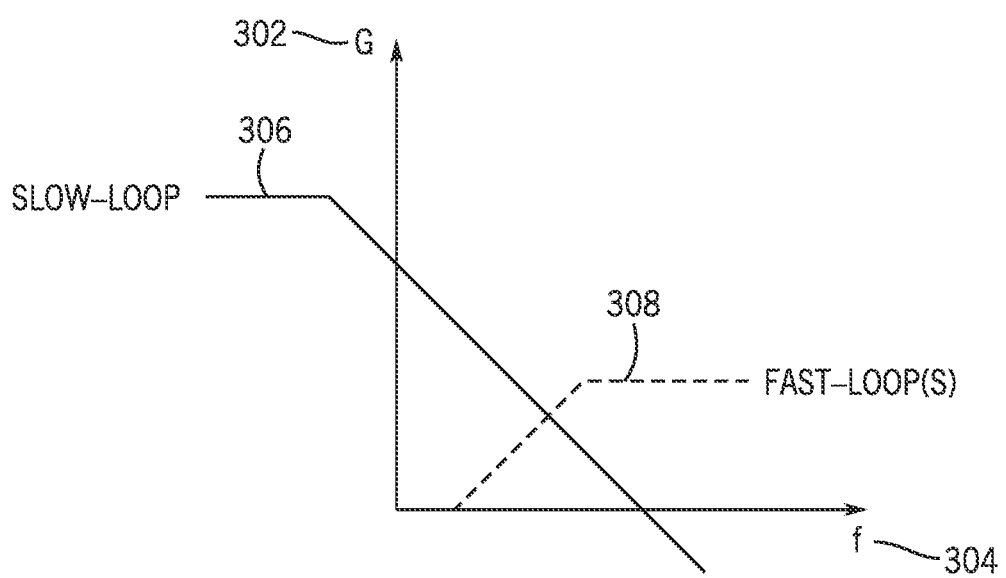
FIG. 11 is a graph of operating characteristics of a slow loop and a fast loop of the supply regulation circuit of FIG. 10, in accordance with an embodiment of the present disclosure.

FIG. 11 is a graph illustrating the operating characteristics of the slow loop 272 and the fast loop 274. Specifically, the gains (represented on the y-axis 302) of the slow loop 272 and the fast loop 274 may vary with a frequency (represented on the x-axis 304) of the supply signal. For example, the error amplifier 252 may be capable of producing a relatively high slow loop gain 306 (e.g., 40 decibels (dB) to 80 dB) when the supply signal fluctuates at low frequency (e.g., less than 1 gigahertz (GHz), less than 1 megahertz (MHz), etc.). By supplying a large gain regulation, the error amplifier 252 may accurately track a reference voltage (e.g., supplied to the differential input port 254A of the error amplifier 252). However, the slow loop gain 306 may drop off as the frequency of the supply signal fluctuations increase. As should be appreciated, in the context of the slow loop 272 and fast loop 274, the terms "slow" and "fast", "low frequency" and "high frequency", as well as "small gain" and "high gain" are relative to each other and are not intended to be limiting to the overall function of the slow loop 272, the fast loop 274, or the LDO 206.

The fast loop gain 308, in contrast, may be limited (e.g., as compared to the slow loop gain 306) when the supply signal fluctuations have a low frequency. However, as the frequency of the supply signal fluctuations increases (e.g., greater than 1 GHz, greater than 1 MHz, greater than MHz, greater than 1,000 MHz, and so on) the fast loop 274 gain 308 may increase. In this manner, the error amplifier 252 may provide the bulk of the gain regulation in the LDO 206 at low frequency, and the amplifier 264 may supplement the gain regulation provided by the error amplifier 252 in the slow loop 272 with small gain regulation at high frequency.

As stated above, as electronic devices (e.g., 10) become increasingly scaled (e.g., smaller), the components (e.g., the pass devices 258) within may also decrease in size. Moreover, as the components become smaller, the operating voltage of the components may also be reduced to reduce the likelihood of shorts and/or voltage/current bleeds. The reduced voltage may result in increased current utilization (e.g., according to the principle P=VI). In other words, to maintain a constant power while utilizing a reduced voltage, the current may be increased proportionally.

With the foregoing in mind, the single-pass device topology of the supply regulation circuit 250 may be utilized with components (e.g., the pass device 258) capable of handling the desired voltages and/or currents. Further, as previously stated, by utilizing only one pass device 258 to supply power to the DAC 40, there may be a voltage gradient across the resistive mesh 280/electrical loads 284 in the DAC 40. As such, a regulation circuit that is capable of splitting the increased currents amongst smaller pass devices while reducing the voltage gradient across the electrical loads 284 may allow more efficient scaling of the electronic device 10.

Figure 12:
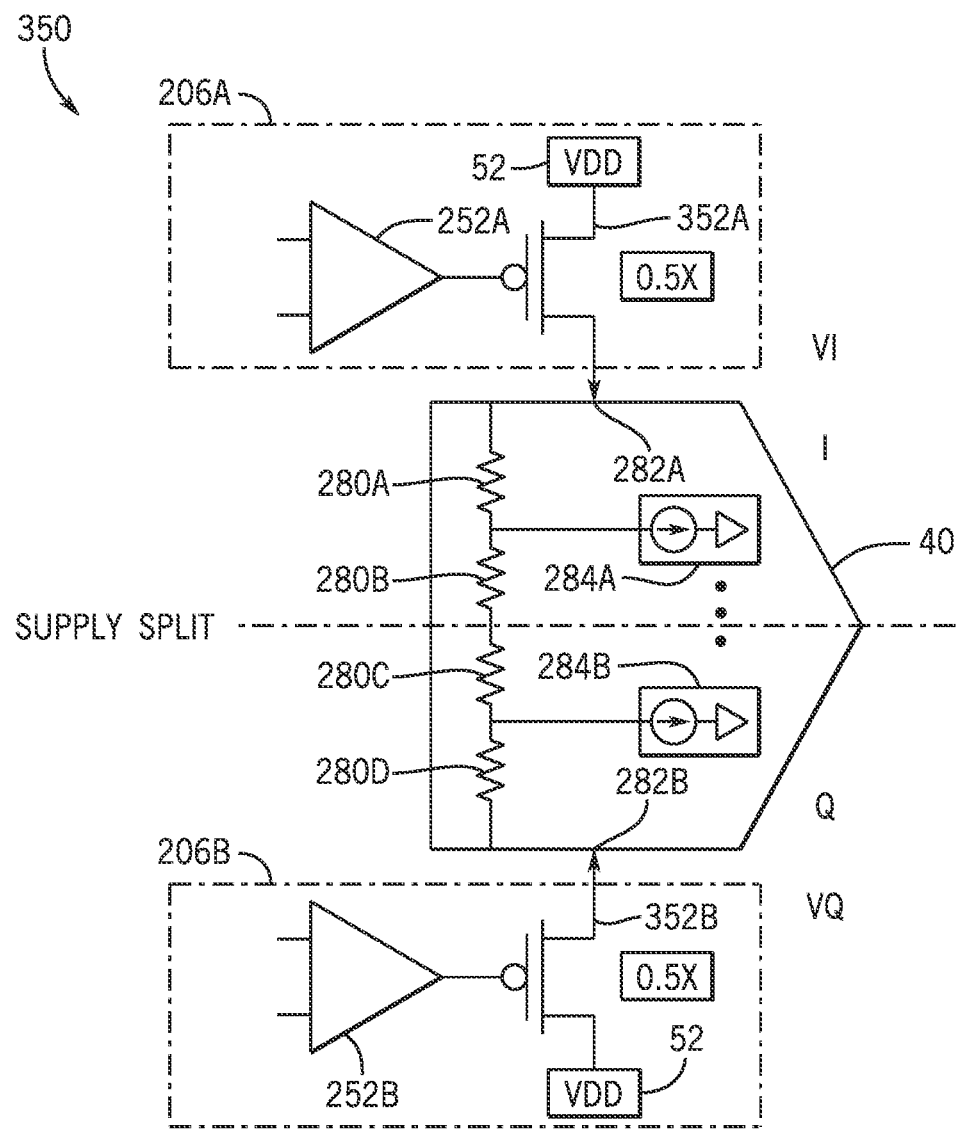
FIG. 12 is a schematic diagram of a supply regulation circuit for the DAC utilizing a dual low dropout regulator (LDO) topology, in accordance with an embodiment of the present disclosure.

FIG. 12 is a schematic diagram of a supply regulation circuit 350 for the DAC 40 utilizing a dual-LDO topology. The supply regulation circuit 350 may include an LDO 206A including an error amplifier 252A and a pass device 352A coupled to a first side of the DAC 40 and an LDO 206B including an error amplifier 252B and a pass device 352B coupled to a second side of the DAC 40. Additionally, as should be appreciated, each LDO 206 may include a respective slow loop 272 and/or a respective fast loop 274 to regulate the pass devices 352. Furthermore, as used herein, the different sides of the DAC 40 may refer to the physical (e.g., geometric) sides of the DAC 40 and/or functional portions (e.g., I loads, Q loads, etc.) of the DAC While the LDOs 206A and 206B are shown to be disposed symmetrically along a vertical axis, it should be noted that the LDOs 206A and 206B may be disposed asymmetrically or symmetrically along a horizontal axis, a diagonal axis, and so on. By utilizing two LDOs (and thus two pass devices 352A and 352B), the supply regulation circuit 350 may supply power to the DAC from multiple sides. This may enable splitting of the current supplied to the DAC 40, with one-half of the total current being handled by one LDO 206A and one-half of the total current being handled by the other LDO 206B. In other words, while being physically smaller and supplying the same power in the aggregate, the pass devices 352A and 352B may each supply half as much power as the pass device 258 of FIG. 10. As such, using a dual-pass device topology may enable using smaller components without sacrificing regulatory capabilities.

Additionally, in some embodiments the DAC 40 may include multiphase elements (e.g., electrical loads 284). In such cases, the DAC may utilize multiphase signals (e.g., an in-phase (i.e., I signal) and a phase-shifted "quadrature" signal (i.e., Q signal)). The independently controlled LDOs 206A and 206B may enable the I and Q power supplies to be split such that one LDO regulates the I signal supply voltage, VI, and the other LDO regulates the Q signal supply voltage VQ separately). Splitting the regulation (e.g., regulating VI and VQ independently, rather than regulating both via a single LDO 206) may simplify (e.g., via reduced analysis or processing) pre-distortion of the I and Q signals to achieve increased linearity. Furthermore, splitting the I and Q power supplies may also mitigate crosstalk between the I and Q power supplies.

By supplying power to multiple sides of the DAC 40, the voltage drop across the resistive mesh 280/electrical loads 284 may be reduced or eliminated. In some embodiments, the resistive mesh 280 and the electrical loads 284 in the DAC 40 may be separated such that one supply (e.g., VI at the input supply 282A) provides power to the electrical load 284A, and another supply (e.g., VQ at the input supply 282B) provides power to the electrical load 284B. As such the LDOs 206A and 206B may independently regulate the voltages at the input supplies 282A and 282B to the respectively split electrical loads 284.

Figure 13:
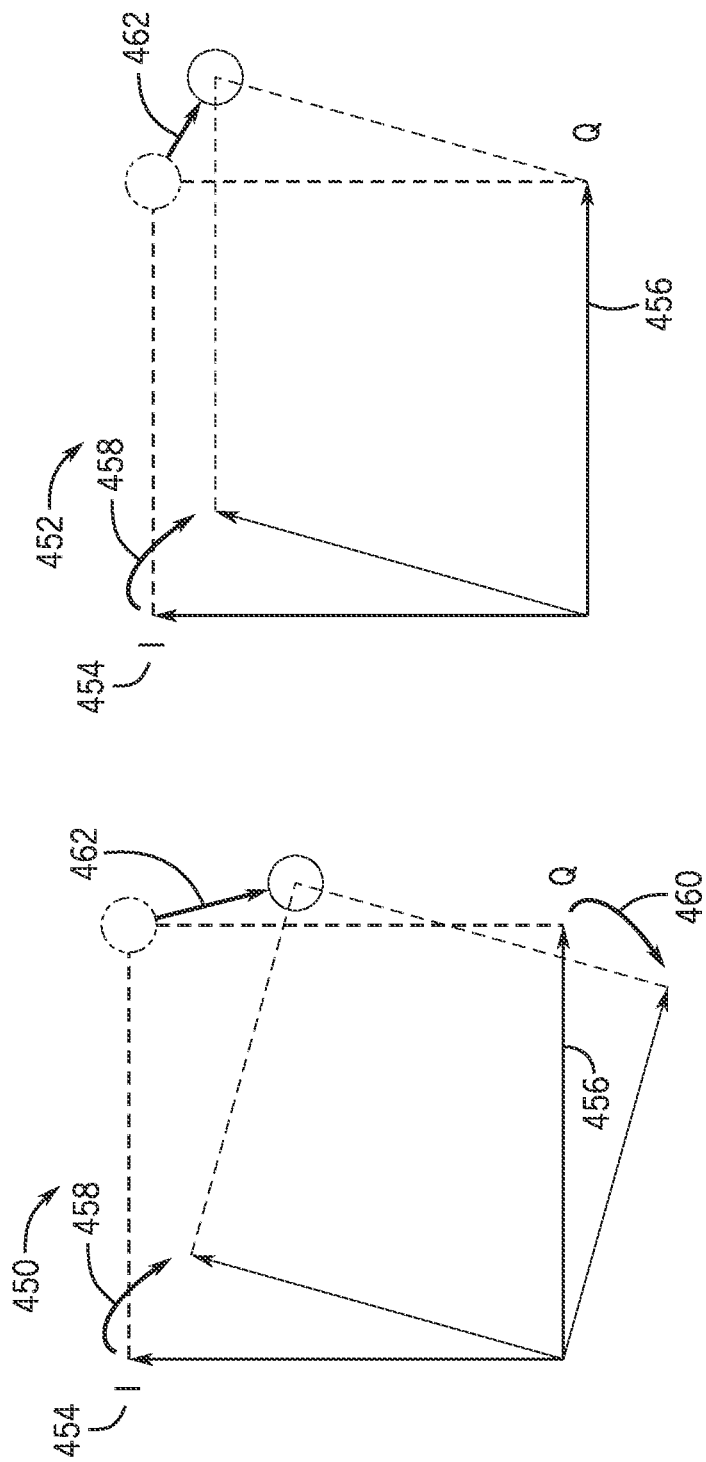
FIG. 13 includes a diagram representing the effect of crosstalk on a shared I and Q power supply and a diagram representing the effect of crosstalk on a split I and Q power supply, in accordance with an embodiment of the present disclosure.

FIG. 13 includes a diagram 450 representing the effect of crosstalk on a shared IQ power supply (e.g., as illustrated in FIG. 10) and a diagram 452 representing the effect of crosstalk on a split I and Q power supply (e.g., as illustrated in FIG. 12). The diagrams 450 and 452 illustrate the I-phase signal (represented on the y-axis 454) and the Q-phase signal (represented on the x-axis 456). In the illustrated example, an I-phase error 458 and a Q-phase error 460 may be compounded to produce a greater overall error 462 in the shared IQ power supply (e.g., supply voltage) than the split I and Q power supply. However, for a split I and Q power supply, an I-phase error 458 may not result in an associated error on the Q-phase, and vice versa. As such, the overall error 462 due to crosstalk between the I and Q power supplies may be lower when split (i.e., regulated independently). However, while splitting the I and Q power supplies may reduce the error experienced by the DAC 40, in some scenarios, the combination of the split I and Q power supplies may result in a higher peak current than a shared IQ power supply.

Figure 14:
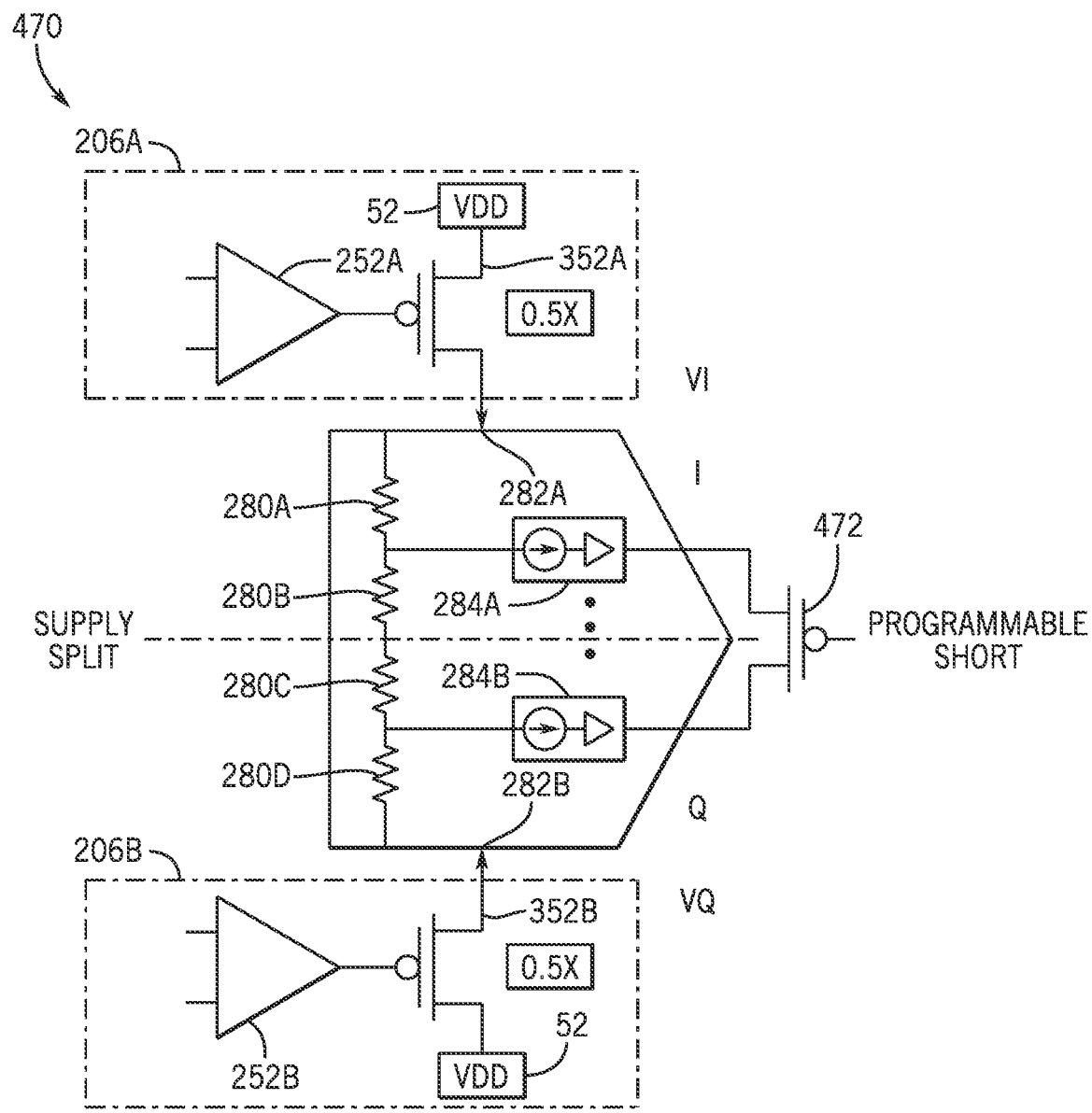
FIG. 14 is a schematic diagram of a supply regulation circuit using a programmable short, in accordance with an embodiment of the present disclosure.

In some embodiments, a supply regulation circuit 470 may use a programmable short 472 to enable flexibility as to whether the I and Q power supplies are shared or split, as shown in FIG. 14. The programmable short 472 may couple the outputs of the pass devices 352A and 352B via a controllable switch (e.g., an nMOS or pMOS) coupled to the electrical loads 284. In some embodiments, the programmable short 472 may be coupled to the resistive mesh 280. For example, the programmable short may be coupled between the resistors 280A and 280B and between the resistors 280C and 280D. In yet other embodiments, the programmable short 472 may be coupled to the supply inputs 282A and 282B of the DAC 40. Furthermore, in some embodiments, the strength (e.g., impedance) of the programmable short 472 may be adjustable. For example, the programmable short 472 may be variable (e.g., continuously or in discrete amounts) between fully shorted (e.g., zero resistance) and open (e.g., infinite resistance). As such, by using a programmable short 472, the supply regulation circuit 470 may selectively utilize the advantages of either shared or split I and Q power supplies or utilize partial benefits of both. For example, if the I and Q loads are expected to, in the aggregate, draw a current above a threshold current, the programmable short 472 may be fully shorted to form a shared IQ power supply (e.g., supply voltage), and if the expected current draw is below the threshold current, the programmable short 472 may be operated in an intermediate resistance or opened to form split I and Q power supplies.

Furthermore, while implementing multiple LDOs (e.g., as discussed with respect to FIGS. 12 and 14) may reduce the current handled by any one pass device, thus, enabling smaller pass devices to be utilized, implementing multiple amplifiers (e.g., error amplifiers 252) may consume excess space and/or lead to a higher combined peak current when implemented independently. Thus, in some embodiments an LDO 206 may include an error amplifier 252 that feeds two slow loops 272 and two fast loops 274 to regulate power to respective sides (e.g., the I loads and Q loads) of the DAC 40, as shown in FIG. 15.

Using such a topology, a single error amplifier 252 may feed multiple pass devices 352 that split the regulation of the loads (e.g., I and Q loads and/or different geometrically positioned loads) of the DAC 40 and provide an effective voltage regulation to the DAC. Additionally, implementing one LDO 206 with multiple pass devices 352 may leverage the benefits of the split I and Q loads and that of a shared IQ supply. For example, one LDO 206 with multiple pass devices 352 regulating the DAC 40 may provide a more effective overall regulation with lower overall error, while reducing cross talk between the I and Q supplies and facilitating pre-distortion, among other advantages.

Figure 15:
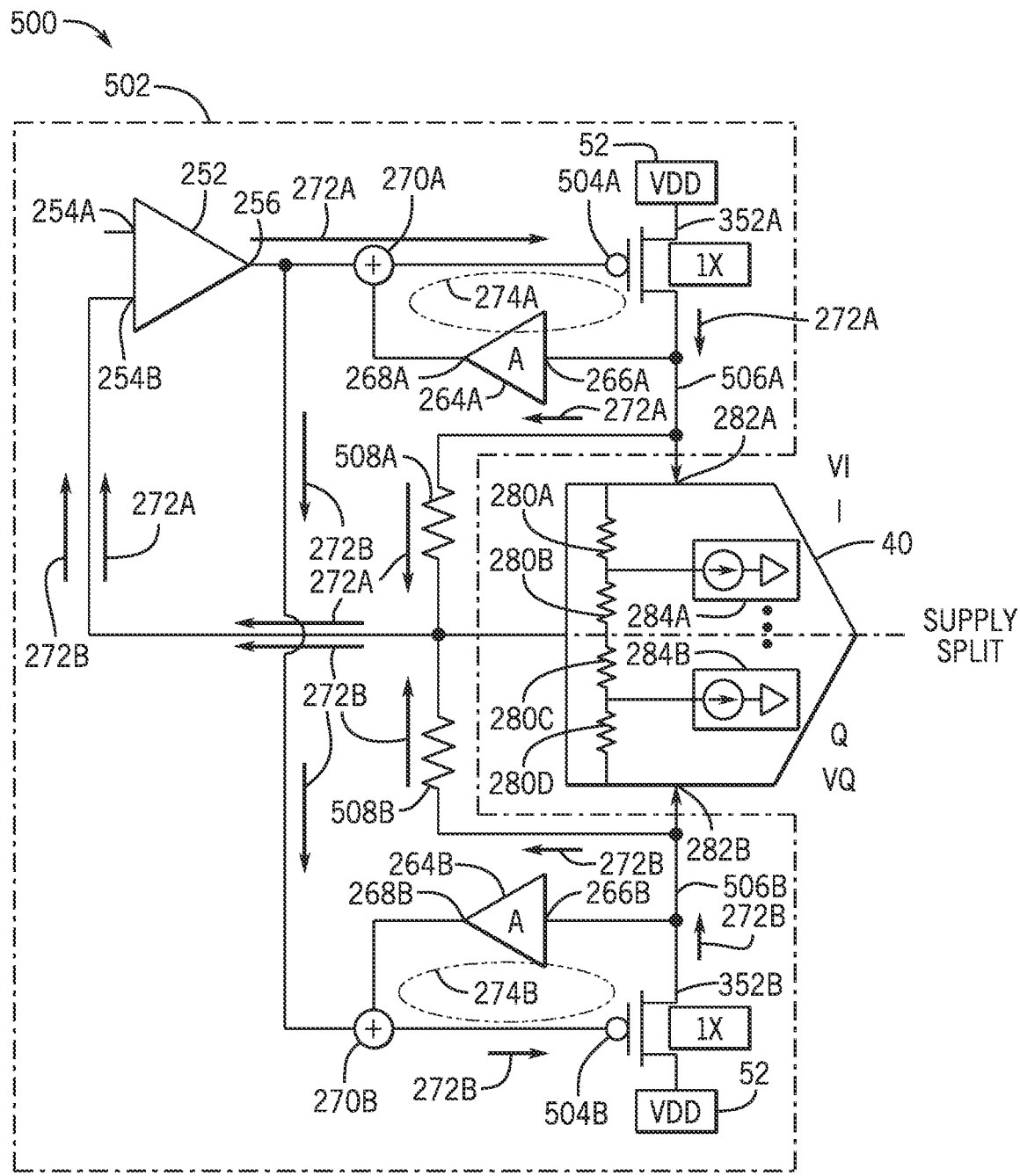
FIG. 15 is a schematic diagram of a supply regulation circuit for a DAC that utilizes a single-LDO, dual pass topology, in accordance with an embodiment of the present disclosure.

FIG. 15 is a schematic diagram of a supply regulation circuit 500 for the DAC 40 that includes an LDO 502 having a single-LDO dual-pass device topology. In some embodiments, the LDO 502 has a dual-pass device topology that includes two pass devices 352A and 352B, each controlled, at least in part, by the error amplifier 252 (e.g., via the pass device regulation signal), that regulate power to respective sides of the DAC 40. The error amplifier 252 includes a first differential input port 254A (e.g., coupled to a reference voltage), a second differential input port 254B, and the output port 256. In some embodiments, the output port 256 of the error amplifier 252 may be coupled to the gate terminal 504A of a first pass device 352A (e.g., via an adder 270A) and the gate terminal 504B of a second pass device 352B (e.g., via an adder 270B). The adder 270A is coupled to the gate terminal 504A of the first pass device 352A such that the sum of the output of the error amplifier 252 (e.g., at output port 256) and the amplifier 264A (e.g., at output port 268A) is fed to the gate terminal 504A of the first pass device 352A (e.g., a pass device regulation signal is fed to the gate terminal 504A). The output terminal 506A of the first pass device 352A is coupled to an input port 266A of the amplifier 264A, to a resistor 508A, and to a first supply input 282A of the DAC 40. The adder 270B is coupled to the gate terminal 504B of the second pass device 352B such that sum of the output of the error amplifier 252 (e.g., at output port 256) and the amplifier 264B (e.g., at output port 268B) is fed to the gate terminal 504B of the second pass device 352B (e.g., a second pass device regulation signal is fed to the gate terminal 504B). The output terminal 506B of the second pass device 352B is coupled to an input port 266B of the amplifier 264B, to a resistor 508B, and to the supply input 282B of the DAC 40.

As the topology of the LDO 502 includes a dual-pass device topology supplying power to multiple sides of the DAC 40, the LDO 502 includes a first slow loop 272A that may provide (e.g., via the error amplifier 252) high gain regulation for supply signal fluctuations at low frequency at the first supply input 282A and a first fast loop 274A that may provide lesser gain regulation, but for high frequency supply signal fluctuations. Furthermore, the LDO 502 may include a second slow loop 272B that provides (e.g., via the error amplifier 252) high gain regulation for supply signal fluctuations at low frequency at the second supply input 282B and a second fast loop 274B that may provide lesser gain regulation, but for high frequency supply signal fluctuations.

In some embodiments, the fast loops 274A and 274B may operate in similar arrangements as the fast loop 274 described in FIG. 10. For example, similar to the fast loop 274 in FIG. 10, the fast loops 274A and 274B of the dual-pass device topology may provide respective feedbacks from the supply signals via the respective amplifiers 264A and 264B and adders 170A and 270B. Additionally, the fast loops 274A and 274B may be positioned near their respective pass devices 352A and 352B to reduce the likelihood of error (e.g., phase error) in the supply signal delivered to the supply inputs 282A and 282B. While two fast loops 274A and 274B are shown in the supply regulation circuit 500, in some embodiments, the supply regulation circuit 500 may include a single fast loop 274 (e.g., fast loop 274A or fast loop 274B) and, thus, a single amplifier 264, or include no fast loops 274.

The slow loops 272A and 272B of the dual pass device topology may operate in a similar fashion as the slow loop 272 of FIG. 10, but with additional resistors 508A and 508B. For example, the slow loops 272A and 272B of the dual pass device topology may provide respective feedbacks from the supply signals to the differential port 254B of the error amplifier 252. However, as there are multiple slow loops 272A and 272B in the dual-pass topology, the feedback signals from the respective supply signals may pass through respective resistors 508A and 508B, for example, to average between supply signals.

Figure 16:
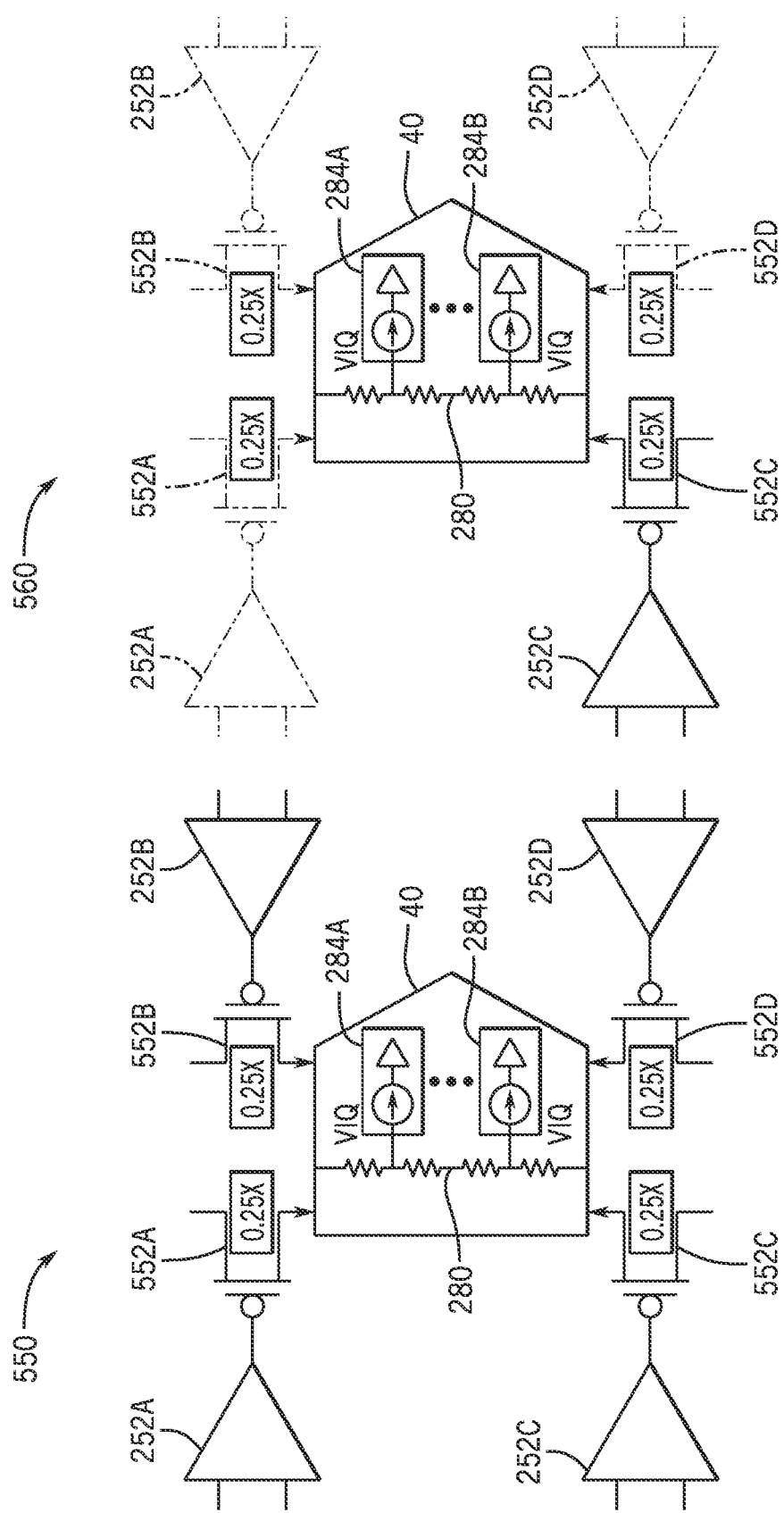
FIG. 16 is a schematic diagram of a supply regulation circuit that includes a four pass device topology at two different power scenarios, in accordance with an embodiment of the present disclosure.

While FIG. 15 illustrates a supply regulation circuit 500 utilizing two pass devices 352A and 352B for the DAC 40, it should be noted that there may be any appropriate number of pass devices and, indeed, any appropriate number of LDOs coupled to the DAC 40. For example, FIG. 16 is a schematic diagram of a supply regulation circuit 550 that includes a four pass device topology. The supply regulation circuit 550 includes four pass devices 552A, 552B, 552C, and 552D (collectively referred to herein as the pass devices 552) coupled to the DAC 40, such that each the pass devices 552 supply power to respective portions of the resistive mesh 280 and/or respective electrical loads 284 when activated. In some embodiments, each pass device 552 may be coupled to a respective error amplifier 252 (e.g., error amplifier 252A, error amplifier 252B, error amplifier 252C, and error amplifier 252D). By increasing the number of pass devices 552, the amount of current supplied by each pass device 552 may be reduced compared to the current supplied by the pass devices 352A and 352B of FIG. 15 and the pass device 258 of FIG. 10. For example, the current supplied by the pass devices 352A and 352B of the dual pass topology may be half of the current of the pass device 258 of FIG. 10, and the pass devices 552 of the four pass topology of FIG. 16 may each supply a fourth of the current of the pass device 258 of FIG. 10.

Moreover, while the configuration of the supply regulation circuit 550 may be useful for high current applications, the individual pass devices 552 and error amplifiers 252 may be deactivated in low power (e.g., reduced power) situations to reduce the overall load. As shown in the supply regulation circuit 560, during a low power scenario, some pass devices 552 (e.g., pass devices 552A, 552B, and 552D), their associated error amplifiers 252 (e.g., error amplifiers 252A, 252B and 252D), and/or fast loop amplifiers 264 (if implemented) may be deactivated, allowing the remaining pass device (e.g., pass device 552C) and the error amplifier (e.g., error amplifier 252C) to supply the reduced current to the DAC 40. For example, if power consumed by the DAC is above a first threshold, all error amplifiers 252 and pass devices 552 may be activated. If the power consumed by the DAC 40 falls below the first threshold but is above a second threshold, one or more (e.g., one, two, three, and so on) error amplifiers 252 and pass devices 552 may be deactivated to conserve power while maintaining sufficient power regulation capabilities for the DAC 40. As should be appreciated, in some embodiments, additional thresholds may be set to disable respective amounts of pass devices 552, error amplifiers 252, and/or amplifiers 264, depending on implementation. And if the power consumed by the DAC 40 falls below the first threshold and the second threshold, all but one error amplifier 252 and one pass device 552 may be deactivated to conserve power. In this way, any number of the pass devices 552 and the error amplifiers 252 may be dynamically activated or deactivated depending on the amount of power to be utilized by the DAC 40 at any period of time.

Furthermore, while four error amplifiers 252 are shown in the supply regulation circuits 550 and 560, it should be noted that fewer error amplifiers 252 may be used. For example, one error amplifier 252 may be connected to multiple pass devices (e.g., one pass device, two pass devices or more, 4 pass devices or more, 10 pass devices or more, and so on) to enable the supply regulation circuits 550 and 560 to leverage the advantages of both a split supply and a shared supply, for example, as discussed in relation to FIG. 15 above. Moreover, when utilizing multiple error amplifiers 252 with one or more pass devices 552 coupled thereto (e.g., forming multiple LDOs 206), programmable shorts 472 may be implemented between the LDOs 206 to leverage the benefits of both a split supply and a shared supply, for example, as discussed in relation to FIG. 14. Additionally, as should be appreciated, in some embodiments each LDO 206 may include one or more slow loops 272 and/or one or more fast loops 274 to regulate the respective pass devices 552, as discussed above in relation to FIGS. 10 and 15. Moreover, in some embodiments different amounts (e.g., zero, one, two, or more) of slow loops 272 and/or fast loops 274 may implemented in different LDOs 206.

Figure 17:
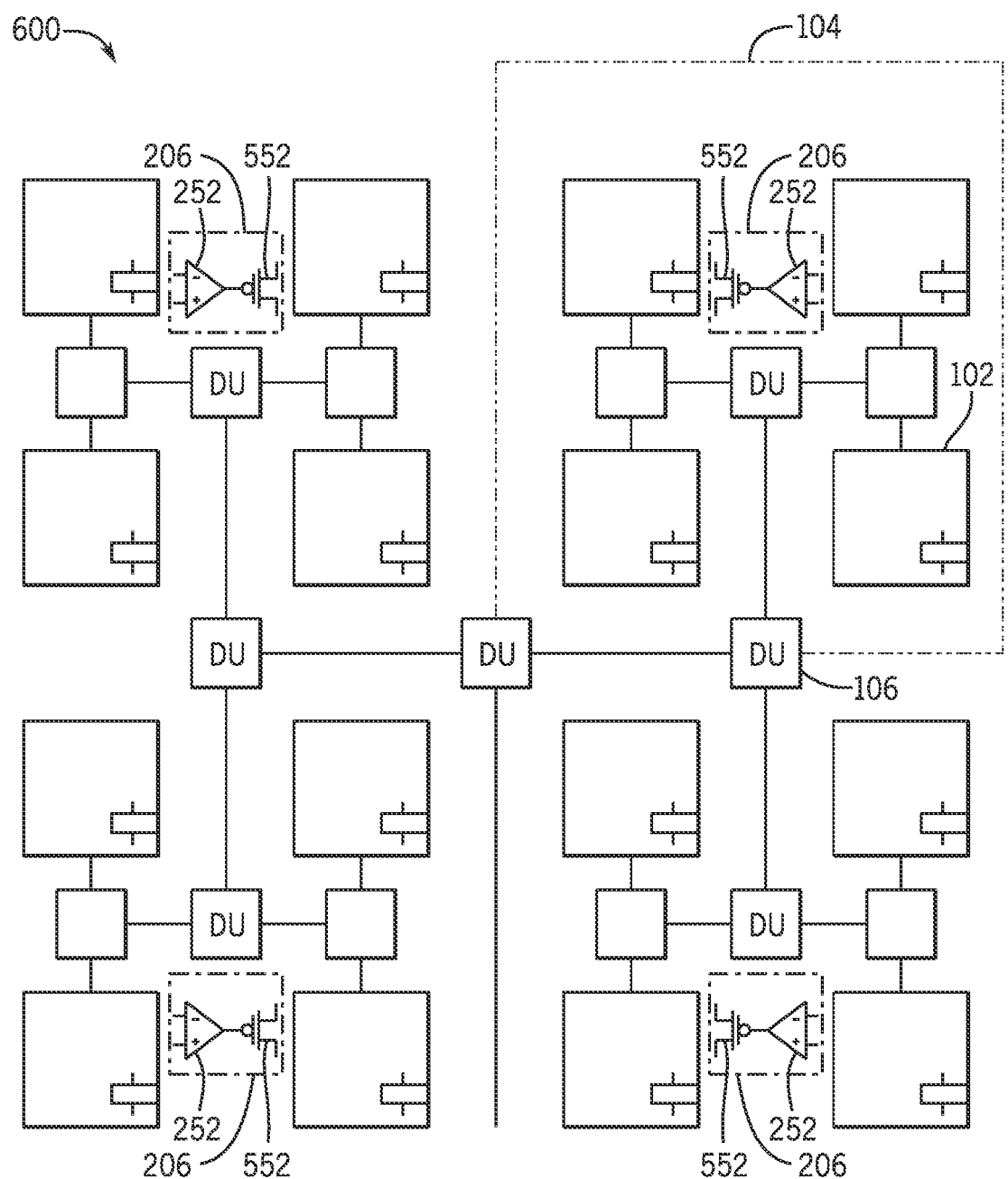
FIG. 17 is a block diagram of a four pass topology as applied to a fractal DAC, in accordance with an embodiment of the present disclosure.

As previously discussed, the DAC 40 may be a column-and-line DAC 114, a fractal DAC 100, or any suitable DAC 40 drawing power from an LDO 206. FIG. 17 is a block diagram of a four pass device topology 600 implemented with a fractal DAC 100. As may be observed, an LDO 206 (e.g., including an error amplifier 252 and a pass device 552) may be placed within a fractal block 104 or otherwise between the unit cells 102 of the fractal DAC 100. In some embodiments, the LDO 206 could be disposed within a control channel of the fractal DAC 100 (e.g., between the unit cells 102). In other embodiments, the LDO 206 may be placed outside of the fractal DAC 100. In still other embodiments, the error amplifiers 252 may be placed outside of the fractal DAC 100 and the pass device 552 may be disposed within the fractal DAC 100, or vice versa. Moreover, as discussed above, fewer error amplifiers 252 may be used to provide regulation to multiple pass devices 552 (e.g., one error amplifier 252, two error amplifiers 252, three error amplifiers 252, and so on).

Figure 18:
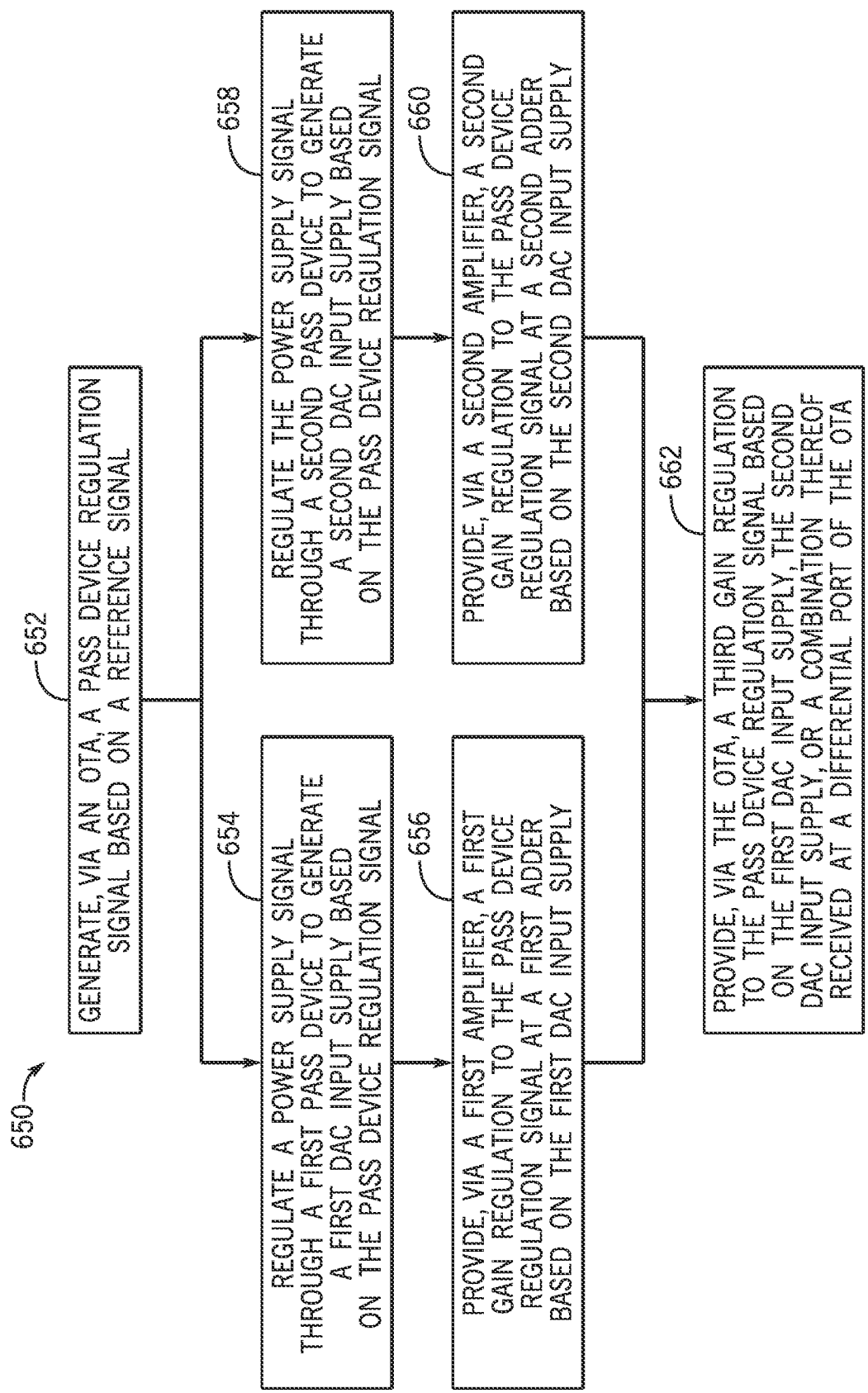
FIG. 18 is a flowchart of a method for regulating power in a supply regulation circuit having a multi-pass topology, in accordance with an embodiment of the present disclosure.

FIG. 18 is a flowchart of a method 650 for regulating power in a supply regulation circuit having a multi-pass topology (e.g., supply regulation circuit 350, 470, 500, or 550). While the method 650 may be described as being performed by the supply regulation circuit 500, it should be noted that method 650 may be performed by any of the supply regulation circuits 350, 470, 500, and/or 550. In some embodiments, any suitable device (e.g., a controller) that may control components of the electronic device 10, such as the processor 12, may perform or regulate the method 650. In some embodiments, the method 650 may be implemented by executing instructions stored in a tangible, non-transitory, computer-readable medium, such as the memory 14 or storage 16, using the processor 12. For example, one or more portions of the method 650 may be performed at least in part by one or more software components, such as an operating system of the electronic device 10, one or more software applications of the electronic device 10, and the like. While the method 650 is described using steps in a specific sequence, it should be understood that the present disclosure contemplates that the described steps may be performed in different sequences than the sequence illustrated, and certain described steps may be skipped or not performed altogether.

In process block 652, the supply regulation circuit (e.g., supply regulation circuit 350, 470, 500, or 550) generates, via an error amplifier (e.g., error amplifier 252) a pass device regulation signal based on a reference signal. In process block 654, the supply regulation circuitry (e.g., supply regulation circuit 350, 470, 500, or 550) regulates a power supply signal (e.g., VDD 52) through a first pass device (e.g., pass device 352A) to generate a first DAC input supply (e.g., input supply 282A) based on the pass device regulation signal. In process block 654 the supply regulation circuit (e.g., supply regulation circuit 350, 470, 500, or 550) provides, via a first amplifier (e.g., amplifier 264A) a first gain regulation by outputting a first gain regulation signal to the pass device regulation signal at a first adder (e.g., adder 270A) based on the first DAC input supply (e.g., input supply 282A).

In process block 658, the supply regulation circuit (e.g., supply regulation circuit 350, 470, 500, or 550) regulates the power supply signal (e.g., VDD 52) through a second pass device (e.g., pass device 352B) to generate a second DAC input supply (e.g., input supply 282B) based on the pass device regulation signal. In process block 660, the supply regulation circuit (e.g., supply regulation circuit 350, 470, 500, or 550) provides, via a second amplifier (e.g., amplifier 264B) a second gain regulation by outputting a second gain regulation signal to the pass device regulation signal at a second adder (e.g., adder 270B) based on the second DAC input supply (e.g., input supply 282B). In process block 662, the supply regulation circuit (e.g., supply regulation circuit 350, 470, 500, or 550) provides, via the error amplifier (e.g., error amplifier 252), a third gain regulation by outputting a third gain regulation signal to the pass device regulation signal based on the first DAC input supply (e.g., input supply 282A), the second DAC input supply (e.g., input supply 282B), or a combination thereof received at a differential port of the error amplifier (e.g., differential port 254B).

In an embodiment, a system includes a digital-to-analog converter (DAC), and first supply regulation circuitry coupled to a first portion of the DAC, the first supply regulation circuitry comprising a first amplifier and a first pass device. The system also includes second supply regulation circuitry coupled to a second portion of the DAC, the second supply regulation circuitry comprising a second amplifier and a second pass device.

The first supply regulation circuitry of the system may provide a first DAC power supply signal to the first portion of the DAC via the first pass device, and the second supply regulation circuitry of the system may provide a second DAC power supply signal to the second portion of the DAC via the second pass device.

The first amplifier of the first supply regulation may regulate, at least in part, the first DAC power supply signal by adjusting a gate voltage of the first pass device based at least in part on the first DAC power supply signal output by the first pass device.

The second amplifier of the second supply regulation may regulate, at least in part, the second DAC power supply signal by adjusting a second gate voltage of the second pass device based at least in part on the second DAC power supply signal output by the second pass device.

The first supply regulation circuitry of the system may include a third amplifier that regulates, at least in part, the first DAC power supply signal by adjusting the gate voltage of the first pass device based at least in part on the first DAC power supply signal. A first adjustment to the gate voltage by the first amplifier may include a higher gain at a lower frequency than a second adjustment to the gate voltage by the third amplifier. The first adjustment and the second adjustment may be combined via an adder.

The first amplifier of the first supply regulation, the second amplifier of the second supply regulation, or both may include an operational transconductance amplifier, wherein the first pass device, the second pass device, or both comprise a metal oxide semiconductor field-effect transistor (MOSFET).

The first supply regulation circuitry and the second supply regulation circuitry of the system may be disposed symmetrically about an axis of the DAC.

A programmable short may be coupled to the DAC that adjusts an impedance between the first portion of the DAC and the second portion of the DAC.

The programmable short may increase the impedance in response to determining that an expected combined current draw of the first portion of the DAC and the second portion of the DAC exceeds a threshold, and decrease the impedance in response to determining that the expected combined current draw is below the threshold.

The DAC may include a first load associated with a first phase and a second load associated with a second phase.

In an embodiment, a method includes generating, via a plurality of power regulation circuits, a plurality of power supply signals, the plurality of power regulation circuits comprising respective pass devices. The method also includes regulating, via the plurality of power regulation circuits, the plurality of power supply signals based at least in part on gate voltages of the respective pass devices. The method further includes supplying, via the plurality of power regulation circuits, the plurality of power supply signals to a digital-to-analog converter (DAC).

The method may also include, in response to determining that an expected power draw of the DAC is below a first threshold, activating a first set of the plurality of power regulation circuits. The method may further include, in response to determining that the expected power draw of the DAC exceeds the first threshold and is below a second threshold, activating a second set of the plurality of power regulation circuits. The method may also include, in response to determining that the expected power draw of the DAC exceeds the second threshold, activating a third set of the plurality of power regulation circuits.

The first set may include fewer power regulation circuits than the second set. The second set may include fewer power regulation circuits than the third set.

A power regulation circuit of the plurality of power regulation circuits may include an amplifier and a pass device of the respective pass devices. The amplifier may regulate a power supply signal of the plurality of power supply signals by regulating a gate voltage of the pass device based at least in part on the power supply signal.

The plurality of power regulation circuits may include a plurality of low-dropout regulators.

In an embodiment, transmit circuitry includes a digital-to-analog converter (DAC), a first pass device that outputs a first power supply signal to a first power input of the DAC, a first amplifier that regulates a first gate voltage of the first pass device based at least in part on the first power supply signal, and a second pass device that outputs a second power supply signal to a second power input of the DAC. The transmit circuitry may also include a second amplifier that regulates a second gate voltage of the second pass device based at least in part on the second power supply signal.

The transmit circuitry may also include a third pass device that outputs a third power supply signal to a third power input of the DAC, a third amplifier that regulates a third gate voltage of the third pass device based at least in part on the third power supply signal, and a fourth pass device that outputs a fourth power supply signal to a fourth power input of the DAC. The transmit circuitry may further include a fourth amplifier that regulates a fourth gate voltage of the fourth pass device based at least in part on the fourth power supply signal.

The first amplifier and the first pass device may deactivate in response to the DAC operating in a reduced power mode.

The DAC may include a fractal DAC having a plurality of unit cells.

The first amplifier, the first pass device, the second amplifier, and the second pass device may be disposed within a control channel of the fractal DAC.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. Transmit circuitry, comprising:
   a digital-to-analog converter (DAC) comprising a first power supply input and a second power supply input; and
   power regulation circuitry comprising a first amplifier, a first pass device, and a second pass device, wherein an output of the first amplifier is coupled to a first gate terminal of the first pass device and is coupled to a second gate terminal of the second pass device, the first pass device comprising a first output coupled to the first power supply input, and the second pass device comprising a second output coupled to the second power supply input.

2. The transmit circuitry of claim 1, wherein the first amplifier is configured to receive a reference voltage and generate a pass device regulation voltage based at least in part on the reference voltage.

3. The transmit circuitry of claim 2, wherein the first amplifier is configured to generate the pass device regulation voltage based at least in part on combined feedback from the first output of the first pass device and the second output of the second pass device.

4. The transmit circuitry of claim 1, wherein the first pass device is configured to supply a first power supply signal to the first power supply input of the DAC, the power regulation circuitry comprising a second amplifier configured to modify a pass device regulation voltage output from the first amplifier based at least in part on the first power supply signal to generate a first modified pass device regulation voltage, and the first pass device is configured to supply the first power supply signal based at least in part on the first modified pass device regulation voltage.

5. The transmit circuitry of claim 4, wherein the second pass device is configured to supply a second power supply signal to the second power supply input of the DAC, the power regulation circuitry comprising a third amplifier configured to modify the pass device regulation voltage based at least in part on the second power supply signal to generate a second modified pass device regulation voltage, and the second pass device is configured to supply the second power supply signal based at least in part on the second modified pass device regulation voltage.

6. The transmit circuitry of claim 4, wherein the second amplifier is configured to modify the pass device regulation voltage via an adder, the adder being configured to combine the pass device regulation voltage output from the first amplifier and an output voltage of the second amplifier.

7. The transmit circuitry of claim 1, wherein the DAC comprises a fractal DAC.

8. The transmit circuitry of claim 7, wherein the first amplifier, the first pass device, or both the first amplifier and the first pass device are disposed within a control channel of the fractal DAC.

9. A system, comprising:
a digital-to-analog converter (DAC) comprising a first power input and a second power input;
a first amplifier configured to receive a reference voltage and regulate a voltage output of the first amplifier based at least in part on the reference voltage;
a first pass device comprising a first gate terminal coupled to the first amplifier and a first output terminal coupled to the first power input of the DAC, the first pass device configured to output a first power via the first output terminal based at least in part on the voltage output of the first amplifier;
a second amplifier configured to regulate a first gate voltage of the first gate terminal of the first pass device based at least in part on the first power and the voltage output of the first amplifier;
a second pass device comprising a second gate terminal coupled to the first amplifier and a second output terminal coupled to the second power input of the DAC, the second pass device configured to output a second power via the second output terminal based at least in part on the voltage output of the first amplifier; and
a third amplifier configured to regulate a second gate voltage of the second gate terminal of the second pass device based at least in part on the second power and the voltage output of the first amplifier.

10. The system of claim 9, comprising:
a first resistor coupled to the first power input and a feedback input of the first amplifier, wherein the first amplifier, the first pass device, and the first resistor form a first voltage regulation loop of the first gate voltage of the first pass device; and
a second resistor coupled to the second power input and the feedback input of the first amplifier, wherein the first amplifier is configured to regulate the voltage output of the first amplifier based at least in part on a feedback voltage at the feedback input of the first amplifier.

11. The system of claim 10, wherein the second amplifier and the first pass device form a second voltage regulation loop of the first gate voltage of the first pass device, the second voltage regulation loop providing a lower amount of gain regulation at a higher frequency than the first voltage regulation loop.

12. The system of claim 11, wherein the first amplifier, the second pass device, and the second resistor form a third voltage regulation loop of the second gate voltage of the second pass device, and wherein the third amplifier and the second pass device form a fourth voltage regulation loop of the second gate voltage of the second pass device, the third voltage regulation loop providing a higher amount of gain regulation at a lower frequency than the fourth voltage regulation loop.

13. The system of claim 12, wherein a first combined regulation loop comprising the first voltage regulation loop and the second voltage regulation loop is configured to regulate the first power via the first pass device, and wherein a second combined regulation loop comprising the third voltage regulation loop and the fourth voltage regulation loop is configured to regulate the second power via the second pass device.

14. The system of claim 9, wherein the DAC comprises a first electrical load configured to receive the first power input and a second electrical load configured to receive the second power input, the first electrical load and the second electrical load being electrically separated.

15. The system of claim 9, wherein the first power input and the second power input are disposed on geometrically opposing sides of the DAC.

16. The system of claim 9, wherein the first amplifier comprises an operational transconductance amplifier, and wherein the first pass device, the second pass device, or both comprise a metal oxide semiconductor field-effect transistor (MOSFET).

17. The system of claim 9, wherein the first power input and the second power input are configured to power different phases of the DAC.

18. A method, comprising:
generating, via a first amplifier, a pass device regulation signal based at least in part on a reference signal;
regulating a power supply signal through a first pass device to generate a first digital-to-analog (DAC) input supply based at least in part on the pass device regulation signal;
regulating the power supply signal through a second pass device to generate a second DAC input supply based at least in part on the pass device regulation signal; and
outputting the first DAC input supply and the second DAC input supply to a DAC.

19. The method of claim 18, comprising:
outputting, via a second amplifier, a first gain regulation to the pass device regulation signal at a first adder based at least in part on the first DAC input supply;
outputting, via a third amplifier, a second gain regulation to the pass device regulation signal at a second adder based at least in part on the second DAC input supply; and
outputting, via the first amplifier, a third gain regulation to the pass device regulation signal based at least in part on the first DAC input supply, the second DAC input supply, or a combination thereof received at a differential port of the first amplifier.

20. The method of claim 19, wherein the third gain regulation comprises a larger gain than the first gain regulation and the second gain regulation.

* * * * *